United States Patent
Mashima et al.

(10) Patent No.: US 10,816,697 B2
(45) Date of Patent: Oct. 27, 2020

(54) POLARIZING PLATE PROTECTIVE FILM, POLARIZING PLATE AND DISPLAY DEVICE

(71) Applicant: ZEON CORPORATION, Chiyoda-ku, Tokyo (JP)

(72) Inventors: Hiromu Mashima, Tokyo (JP); Takamichi Inomata, Tokyo (JP)

(73) Assignee: ZEON CORPORATION, Chiyoda-ku, Tokyo (JP)

(*) Notice: Subject to any disclaimer, the term of this patent is extended or adjusted under 35 U.S.C. 154(b) by 38 days.

(21) Appl. No.: 16/308,566

(22) PCT Filed: Jun. 23, 2017

(86) PCT No.: PCT/JP2017/023274
§ 371 (c)(1),
(2) Date: Dec. 10, 2018

(87) PCT Pub. No.: WO2018/003715
PCT Pub. Date: Jan. 4, 2018

(65) Prior Publication Data
US 2019/0162876 A1 May 30, 2019

(30) Foreign Application Priority Data
Jun. 30, 2016 (JP) ................... 2016-130320

(51) Int. Cl.
| G02B 1/04 | (2006.01) |
| C08F 287/00 | (2006.01) |
| C08L 51/00 | (2006.01) |
| H01L 27/32 | (2006.01) |
| G02B 5/30 | (2006.01) |
| H01L 51/50 | (2006.01) |
| H01L 51/52 | (2006.01) |
| G09F 9/30 | (2006.01) |
| H05B 33/02 | (2006.01) |
| G02B 1/08 | (2006.01) |
| G02F 1/1335 | (2006.01) |

(52) U.S. Cl.
CPC ............. *G02B 1/04* (2013.01); *C08F 287/00* (2013.01); *C08L 51/00* (2013.01); *G02B 1/08* (2013.01); *G02B 5/30* (2013.01); *G02B 5/3025* (2013.01); *G02F 1/133528* (2013.01); *G09F 9/30* (2013.01); *H01L 27/32* (2013.01); *H01L 51/50* (2013.01); *H01L 51/5293* (2013.01); *H05B 33/02* (2013.01)

(58) Field of Classification Search
CPC ............... C08F 287/00; G02B 5/3025; G02F 1/133528
See application file for complete search history.

(56) References Cited

U.S. PATENT DOCUMENTS

| 2015/0329750 A1* | 11/2015 | Ishiguro ............... C09J 153/005 525/98 |
| 2016/0146977 A1 | 5/2016 | Ishiguro et al. |
| 2016/0343986 A1* | 11/2016 | Inoue ................... B32B 27/302 |

FOREIGN PATENT DOCUMENTS

| CN | 105359011 A | 2/2016 |
| EP | 3089551 A1 | 11/2016 |
| JP | 2009109860 A | 5/2009 |
| JP | 2010042667 A | 2/2010 |
| JP | 2012145645 A | 8/2012 |
| JP | 2012173487 A | 9/2012 |
| JP | 2012245632 A | 12/2012 |
| JP | 2013223935 A | 10/2013 |
| WO | WO 2014077267 * | 5/2014 |
| WO | 2015002020 A1 | 1/2015 |
| WO | 2015099079 A1 | 7/2015 |
| WO | WO 2015115337 * | 8/2015 |
| WO | 2019131457 A1 | 7/2019 |

OTHER PUBLICATIONS

Sep. 19, 2017, International Search Report issued in the International Patent Application No. PCT/JP2017/023274.
Jan. 1, 2019, International Preliminary Report on Patentability issued in the International Patent Application No. PCT/JP2017/023274.
Jan. 29, 2020, the Extended European Search Report issued by the European Patent Office in the corresponding European Patent Application No. 17820072.1.
Jul. 1, 2020, Office Action issued by the China National Intellectual Property Administration in the corresponding Chinese Patent Application No. 201780036297.9.

* cited by examiner

*Primary Examiner* — Jeffrey C Mullis
(74) *Attorney, Agent, or Firm* — Kenja IP Law PC

(57) ABSTRACT

A polarizing plate protective film including a resin layer that has a melt flow rate M [g/10 min] at a temperature of 190° C. and a load of 2.16 kg satisfying the following formula (1):

$$5 \text{ g/10 min} \leq M \qquad \text{Formula (1)}.$$

An adhesion strength caused by press-bonding of the resin layer to a glass plate surface is 1.0 N/10 mm or more. The glass plate surface is a surface having an arithmetic average roughness of 3 nm which has been subjected to a corona treatment under conditions of an output of 300 W and a discharge amount of 200 W·min/m². The press-bonding is performed under conditions of a temperature of 110° C., a linear pressure of 25 N/mm, and a speed of 0.04 m/min. The polarizing plate protective film has a tensile elastic modulus E [MPa] satisfying the following formula (2):

$$200 \text{ MPa} \leq E \leq 1{,}200 \text{ MPa} \qquad \text{Formula (2)}.$$

5 Claims, No Drawings

POLARIZING PLATE PROTECTIVE FILM, POLARIZING PLATE AND DISPLAY DEVICE

FIELD

The present invention relates to a polarizing plate protective film, as well as a polarizing plate and a display device which include the polarizing plate protective film.

BACKGROUND

There is known a display device including a display body and a polarizing plate. A known example of such a display device is a liquid crystal display device which includes: a liquid crystal display body containing a pair of transparent substrates and a liquid crystal compound enclosed between these substrates; and a polarizing plate disposed on one side or both sides of the liquid crystal display body. Another known example is an organic electroluminescent display device (hereinafter, sometimes appropriately referred to as an "organic EL display device") which includes: an organic electroluminescent display body (hereinafter, sometimes appropriately referred to as an "organic EL display body") containing a substrate, an electrode, and a light-emitting layer; and a polarizing plate disposed for suppressing light reflection in this organic EL display body.

In prior art, the polarizing plate disposed in the aforementioned display devices generally included a polarizer and a polarizing plate protective film bonded to both sides of the polarizer. The polarizing plate was often bonded to the display body with an adhesive.

In recent years, attempts have been made to reduce thickness of the polarizing plate for reducing thickness of the display device. In such attempts, a polarizing plate including the polarizing plate protective film provided only to one side of the polarizer with the other side one being omitted has been proposed (Patent Literatures 1 and 2).

CITATION LIST

Patent Literature

Patent Literature 1: Japanese Patent Application Laid-Open No. 2012-145645 A
Patent Literature 2: Japanese Patent Application Laid-Open No. 2009-109860 A

SUMMARY

Technical Problem

The aforementioned polarizing plate including the polarizing plate protective film provided to only one side of the polarizer is usually bonded to the display body through an adhesive on the side of the polarizer opposite to the side where the polarizing plate protective film is provided. However, with the polarizing plate in which one of the polarizing plate protective films is omitted in this manner, the protection of the polarizer sometimes becomes insufficient, thereby causing a decrease in polarization degree due to moisture or occurrence of cracks in the polarizer due to a heat shock. Also, when the polarizing plate protective film is omitted, the stiffness of the polarizing plate is sometimes impaired, causing the polarizing plate to become susceptible to scratches. Furthermore, the bonding with an adhesive sometimes causes peeling under high temperature environment or high humidity environment. Such peeling sometimes arises difficulty in protection of the polarizer.

The present invention has been devised in view of the aforementioned problems. An object of the present invention is to provide: a polarizing plate protective film which can reduce thickness of a display device including a polarizing plate and can favorably protect a polarizer; and a polarizing plate and a display device which include the polarizing plate protective film.

Solution to Problem

The present inventor extensively conducted researches for solving the aforementioned problems. As a result, the present inventor has found that the aforementioned problems can be solved by using, as a polarizing plate protective film, a film which has desirable properties and can be bonded to a display body without an adhesive. Thus, the present invention has been completed.

That is, the present invention includes the following.

<1> A polarizing plate protective film comprising a resin layer that has a melt flow rate M [g/10 min] at a temperature of 190° C. and a load of 2.16 kg satisfying the following formula (1):

$$5 \text{ g/10 min} \leq M \qquad \text{Formula (1)}$$

wherein:
an adhesion strength caused by press-bonding of the resin layer to a glass plate surface is 1.0 N/10 mm or more, wherein the glass plate surface is a surface having an arithmetic average roughness of 3 nm which has been subjected to a corona treatment under conditions of an output of 300 W and a discharge amount of 200 W·min/m², and the press-bonding is performed under conditions of a temperature of 110° C., a linear pressure of 25 N/mm, and a speed of 0.04 m/min, and the polarizing plate protective film has a tensile elastic modulus E [MPa] satisfying the following formula (2):

$$200 \text{ MPa} \leq E \leq 1{,}200 \text{ MPa} \qquad \text{Formula (2)}.$$

<2> The polarizing plate protective film according to <1>, wherein the resin layer contains an alkoxysilyl group.

<3> The polarizing plate protective film according to <1> or <2>, wherein a water vapor transmission rate W [g/m²/day] at 100 μm-thickness conversion amount of the polarizing plate protective film satisfies the formula (3), $$W \leq 10 \text{ g/m}^2/\text{day} \qquad \text{Formula (3)}.$$

<4> The polarizing plate protective film according to any one of <1> to <3>, wherein
the resin layer contains an alkoxysilyl group-modified product [3],
the alkoxysilyl group-modified product [3] is an alkoxysilyl group-modified product of a hydrogenated product [2] obtained by hydrogenating 90% or more of carbon-carbon unsaturated bonds in a main chain and a side chain in a block copolymer [1] and carbon-carbon unsaturated bonds of an aromatic ring in a block copolymer [1],
the block copolymer [1] has two or more polymer blocks [A] per one molecule of the block copolymer [1], and one or more polymer blocks [B] per one molecule of the block copolymer [1], the polymer block [A] containing an aromatic vinyl compound unit as a main component, the polymer block [B] containing a chain conjugated diene compound unit as a main component, and
a ratio (wA/wB) of a weight fraction wA of the polymer blocks [A] in the entire block copolymer [1] and a weight fraction wB of the polymer blocks [B] in the entire block copolymer [1] falls within a range of 30/70 to 60/40.

<5> The polarizing plate protective film according to any one of <1> to <4>, wherein the resin layer contains a plasticizer.

<6> A polarizing plate comprising: the polarizing plate protective film according to any one of <1> to <5>; and a polarizer.

<7> A display device comprising: a display body including a substrate; and the polarizing plate according to <6>, wherein the polarizing plate protective film of the polarizing plate and the substrate are in contact with each other.

Advantageous Effects of Invention

According to the present invention, there can be provided: a polarizing plate protective film which can reduce thickness of a display device including a polarizing plate and can favorably protect a polarizer; and a polarizing plate and a display device which contain the polarizing plate protective film.

DESCRIPTION OF EMBODIMENTS

Hereinafter, the present invention will be described in detail with reference to embodiments and examples. However, the present invention is not limited to the following embodiments and examples, and may be freely modified for implementation without departing from the scope of claims of the present invention and the scope of their equivalents.

In the following description, "polarizing plate", and "substrate" include not only a rigid member but also a flexible member such as a resin film, unless otherwise specified.

[1. Summary of Polarizing Plate Protective Film]

The polarizing plate protective film according to the present invention is a film to be bonded to a polarizer for protecting the polarizer, and satisfies the following requirements (i) to (iii).

(i) The polarizing plate protective film includes a resin layer having a melt flow rate in a specific range.

(ii) The resin layer has adhesion strength to a glass plate in a specific range.

(iii) The polarizing plate protective film has a tensile elastic modulus in a specific range.

In the following description, the aforementioned resin layer is sometimes appropriately referred to as a "specific resin layer".

[2. Melt Flow Rate of Specific Resin Layer]

The polarizing plate protective film includes the specific resin layer having a specific melt flow rate M. Herein, the melt flow rate of the specific resin layer indicates the melt flow rate of a resin contained in the specific resin layer. Therefore, the polarizing plate protective film includes the specific resin layer formed of a resin having a specific melt flow rate M.

Specifically, the melt flow rate M [g/10 min] at a temperature of 190° C. and a load of 2.16 kg of the specific resin layer satisfies the following formula (1).

$$5 \text{ g/10 min} \leq M \quad \text{Formula (1)}$$

More particularly, the melt flow rate M of the specific resin layer is usually 5 g/10 min or more, preferably 6 g/10 min or more, and more preferably 7 g/10 min or more. Since the specific resin layer having such a high melt flow rate exerts high flowability during hot press-bonding, it can easily spread. Therefore, when hot press-bonding of the polarizing plate to a display body is performed, the polarizing plate protective film including the specific resin layer can adhere to the display body with a high adhesion area. Thus, the generation of air bubbles and air gaps can be suppressed, and favorable adhesion, in particular, at edges can be achieved. This can suppress the intrusion of water vapor through the air bubbles or air gaps, with the result that the polarizing plate has improved moisture resistance. Also, since the specific resin layer having the aforementioned melt flow rate M can easily spread during hot press-bonding, the polarizing plate protective film can have low tendency to cause local deformation, and therefore occurrence of wrinkles can be easily suppressed. Furthermore, since the specific resin layer having the aforementioned melt flow rate M can obtain a high adhesion area, the polarizing plate protective film can have increased adhesion strength. In addition, since the specific resin layer having the aforementioned melt flow rate M becomes flexible at high temperature while being unlikely to lose adhesion strength, peeling of the polarizing plate protective film under high temperature environment can be avoided.

The melt flow rate M of the specific resin layer is preferably 80 g/10 min or less, more preferably 60 g/10 min or less, and particularly preferably 40 g/10 min or less. When the melt flow rate M is equal to or less than the aforementioned upper limit value, occurrence of excessive flowability of the polarizing plate protective film during hot press-bonding can be avoided, and bonding can thereby be easily performed.

The melt flow rate M of the specific resin layer may be measured in accordance with JIS K7210, using a melt indexer as a measuring device, under the conditions of a temperature of 190° C. and a load of 2.16 kg.

[3. Adhesion Strength of Specific Resin Layer to Glass Plate]

The specific resin layer is a layer, the adhesion strength caused by press-bonding thereof to a glass plate surface being within a specific range, wherein the glass plate surface is a surface having an arithmetic average roughness of 3 nm which has been subjected to a corona treatment under the conditions of an output of 300 W and a discharge amount of 200 W·min/m$^2$, and the press-bonding is performed under the conditions of a temperature of 110° C., a linear pressure of 25 N/mm, and a speed of 0.04 m/min. Specifically, the adhesion strength is usually 1.0 N/10 mm or more, more preferably 2.0 N/10 mm or more, and particularly preferably 3.0 N/10 mm or more.

The substrate of the display body on which the polarizing plate is disposed in the display device may be formed of various types of materials, for example, an organic material such as resin and an inorganic material such as glass. The polarizing plate protective film including the specific resin layer having high adhesion strength to the surface of a glass plate as previously described can be bonded to a wide variety of types of members without an adhesive. Therefore, an adhesive is not required for disposing the polarizing plate protective film in the display device. This enables decrease in thickness by the thickness of the layer of an adhesive. Therefore, thickness reduction of the display device can be achieved. In particular, since the polarizing plate protective film including the specific resin layer is particularly excellent in the compatibility to an inorganic member such as a glass plate, it can be particularly strongly bonded to a substrate formed of an inorganic material such as glass.

The upper limit value of the adhesion strength is not particularly limited, but may be, for example, 10.0 N/10 mm or less, 8.0 N/10 mm or less, and 6.0 N/10 mm or less, from the viewpoint of facilitating the production of the polarizing plate protective film.

The adhesion strength may be measured by the following method.

A rectangular test piece with a size of 10 mm in width× 100 mm in length including a specific resin layer on its surface is prepared. In particular, when the test piece includes a polarizer, the lengthwise direction of the test piece is arranged in such a manner as to coincide with the absorption axis direction of the polarizer. This test piece is press-bonded to a glass plate surface, wherein the glass plate surface is a surface having an arithmetic average roughness of 3 nm which has been subjected to a corona treatment under the conditions of an output of 300 W and a discharge amount of 200 W·min/m$^2$, and the press-bonding is performed by a laminator under the conditions of a temperature of 110° C., a linear pressure of 25 N/mm, and a speed of 0.04 m/min. After that, the peel strength in the lengthwise direction of the test piece was measured as the adhesion strength, by pulling the test piece in the 180° direction with respect to the glass plate surface using a peel tester at a speed of 300 ram/min.

The arithmetic average roughness Ra of a certain surface may be measured using a surface roughness tester in accordance with JIS B 0601:1994. The arithmetic average roughness Ra is a value obtained by blocking long wavelength components through a high-pass filter with a cutoff value λc from a measured cross section curve to acquire a profile curve (roughness curve), and calculating an average value of the absolute values of the heights (distances from an average line to a measured curve) in a reference length of the profile curve.

The aforementioned adhesion strength can be achieved by, for example, appropriately selecting the type of a resin to serve as a material of the specific resin layer. In particular, as the polymer contained in the resin, it is preferable to use a polymer containing a silicon atom-containing group, and particularly preferable to use a polymer containing an alkoxysilyl group. For achieving the aforementioned high adhesion, it is preferable to use a resin having a high melt flow rate.

[4. Tensile Elastic Modulus of Polarizing Plate Protective Film]

The tensile elastic modulus E [MPa] of the polarizing plate protective film satisfies the formula (2).

$$200 \text{ MPa} \leq E \leq 1200 \text{ MPa} \quad \text{Formula (2)}$$

More specifically, the tensile elastic modulus E of the polarizing plate protective film is usually 200 MPa or more, preferably 300 MPa or more, and more preferably 400 MPa or more, and is usually 1200 MPa or less, preferably 1100 MPa or less, and more preferably 1000 MPa or less. When the tensile elastic modulus E of the polarizing plate protective film is equal to or more than the aforementioned lower limit value, the polarizer can be sufficiently protected, thereby suppressing the occurrence of cracks in the polarizer. Further, since the stiffness of the polarizing plate can be increased, deformation of the polarizing plate due to external force and occurrence of scratches can be suppressed. When the tensile elastic modulus E of the polarizing plate protective film is equal to or less than the aforementioned upper limit value, the film deforms to follow the surface of the display body during lamination, thereby suppressing occurrence of air bubbles and wrinkles during bonding.

The tensile elastic modulus E of the polarizing plate protective film may be measured in accordance with JIS K7113 using a tensile tester by the following method.

From the polarizing plate protective film, a rectangular test piece (10 mm in width×250 mm in long edge length) having a long edge parallel to the lengthwise direction of the film is cut out. This test piece is strained in the long edge direction for distortion, and the stress caused thereby is measured. The conditions for measuring the stress are a temperature of 23° C., a humidity of 60±5% RH, an interchuck distance of 115 mm, and a tensile rate of 50 mm/min. This stress measurement is performed three times. From measurement data of the measured stress and a distortion corresponding to the stress, four pieces of measurement data are selected at intervals of 0.2% in the test piece distortion range of 0.6% to 1.2% (that is, measurement data at distortions of 0.6%, 0.8%, 1.0% and 1.2%). From four pieces of measurement data in three measurements (total: 12 pieces of measurement data), the tensile elastic modulus is calculated by a least square method.

[5. Composition and Structure of Polarizing Plate Protective Film]

The polarizing plate protective film is a film containing the above-mentioned specific resin layer. As the resin contained in the specific resin layer, a thermoplastic resin is usually used from the viewpoint of realizing a high melt flow rate as described above. Therefore, the specific resin layer usually contains a thermoplastic polymer and optional components used as necessary.

The polarizing plate protective film may be a film of a single layer structure having only one layer. Alternatively, the polarizing plate protective film may be a film of a multilayer structure having two or more layers. When the polarizing plate protective film has a multilayer structure, the outermost layer thereof is preferably the specific resin layer. In particular, in the polarizing plate protective film, the outermost layer to be in contact with the substrate of the display body is preferably the specific resin layer. Since the specific resin layer has excellent affinity with the substrate of the display body, the polarizing plate protective film having such the specific resin layer as the outermost layer can realize high adhesion strength.

From the viewpoint of realizing high adhesion strength to a glass plate, the specific resin layer preferably contains an alkoxysilyl group. Therefore, the resin contained in the specific resin layer preferably contains an alkoxysilyl group.

In the resin contained in the specific resin layer, the weight ratio of the alkoxysilyl group is preferably 0.1% by weight or more, more preferably 0.2% by weight or more, and particularly preferably 0.3% by weight or more, and preferably 10% by weight or less, more preferably 5% by weight or less, and particularly preferably 3% by weight or less. When the weight ratio of the alkoxysilyl group is equal to or more than the lower limit value of the aforementioned range, affinity of the resin to the substrate of the display body can be enhanced and the adhesion strength can be effectively increased. On the other hand, when the weight ratio of the alkoxysilyl group is equal to or less than the upper limit value of the aforementioned range, embrittlement of the resin can be suppressed and the mechanical strength can be enhanced.

The ratio of the alkoxysilyl group may be determined on the basis of a measurement value obtained by measuring the amount of the alkoxysilyl group in the polymer by $^1$H-NMR spectrum. When the amount of the alkoxysilyl group is small, the number of times of integration may be increased to measure the amount of the alkoxysilyl group.

Examples of appropriate resins containing the alkoxysilyl group may include thermoplastic resins containing a polymer containing an alkoxysilyl group and an optional component as necessary. As the polymer containing an alkoxysilyl group, it is preferable to use an alkoxysilyl group-modified product [3] of a hydrogenated product [2] obtained by hydrogenating the unsaturated bond of the specific block copolymer [1].

The block copolymer [1] is a block copolymer having two or more polymer blocks [A] per one molecule of the block copolymer [1] and one or more polymer blocks [B] per one molecule of the block copolymer [1].

The polymer block [A] is a polymer block containing an aromatic vinyl compound unit as a main component. The aromatic vinyl compound unit is a structural unit having a structure formed by polymerizing an aromatic vinyl compound.

Examples of the aromatic vinyl compound corresponding to the aromatic vinyl compound unit contained in the polymer block [A] may include styrene; styrenes having an alkyl group of 1 to 6 carbon atoms as a substituent such as α-methylstyrene, 2-methylstyrene, 3-methylstyrene, 4-methylstyrene, 2,4-dimethylstyrene, 2,4-diisopropylstyrene, 4-t-butylstyrene, and 5-t-butyl-2-methylstyrene; styrenes having a halogen atom as a substituent such as 4-chlorostyrene, dichlorostyrene, and 4-monofluorostyrene; styrenes having an alkoxy group of 1 to 6 carbon atoms as a substituent such as 4-methoxystyrene; styrenes having an aryl group as a substituent such as 4-phenylstyrene; and vinyl naphthalenes such as 1-vinylnaphthalene and 2-vinylnaphthalene. One type of these may be solely used, and two or more types thereof may also be used in combination at any ratio. Among these, from the viewpoint of capability of lowering hygroscopicity, aromatic vinyl compounds containing no polar group such as styrene and styrenes having an alkyl group of 1 to 6 carbon atoms as a substituent are preferable, and from the viewpoint of industrial availability, styrene is particularly preferable.

The content ratio of the aromatic vinyl compound unit in the polymer block [A] is preferably 90% by weight or more, more preferably 95% by weight or more, and particularly preferably 99% by weight or more. When the polymer block [A] contains the aforementioned large amount of the aromatic vinyl compound unit, hardness and heat resistance of the polarizing plate protective film can be increased.

The polymer block [A] may contain an optional structural unit other than the aromatic vinyl compound unit. The polymer block [A] may contain solely one type of the optional structural unit, and may also contain two or more types thereof in combination at any ratio.

Examples of the optional structural unit that the polymer block [A] may contain may include a chain conjugated diene compound unit. Herein, the chain conjugated diene compound unit refers to a structural unit having a structure formed by polymerizing a chain conjugated diene compound. Examples of the chain conjugated diene compound corresponding to the chain conjugated diene compound unit may include the same examples as those exemplified as the examples of the chain conjugated diene compound corresponding to the chain conjugated diene compound unit that the polymer block [B] contains.

Further examples of the optional structural unit that the polymer block [A] may contain may include a structural unit having a structure formed by polymerizing an optional unsaturated compound other than the aromatic vinyl compound and the chain conjugated diene compound. Examples of the optional unsaturated compound may include a vinyl compound such as a chain vinyl compound and a cyclic vinyl compound; an unsaturated cyclic acid anhydride; and an unsaturated imide compound. These compounds may have a substituent such as a nitrile group, an alkoxycarbonyl group, a hydroxycarbonyl group, or a halogen group. Among these, from the viewpoint of hygroscopicity, vinyl compounds having no polar group such as chain olefins of 2 to 20 carbon atoms per molecule such as ethylene, propylene, 1-butene, 1-pentene, 1-hexene, 1-heptene, 1-octene, 1-nonene, 1-decene, 1-dodecene, 1-eicosene, 4-methyl-1-pentene, and 4,6-dimethyl-1-heptene; and cyclic olefins of 5 to 20 carbon atoms per molecule such as vinylcyclohexane are preferable. A chain olefin of 2 to 20 carbon atoms per molecule is more preferable, and ethylene and propylene are particularly preferable.

The content ratio of the optional structural unit in the polymer block [A] is usually 10% by weight or less, preferably 5% by weight or less, and more preferably 1% by weight or less.

The number of the polymer blocks [A] in one molecule of the block copolymer [1] is preferably 2 or more, and is preferably 5 or less, more preferably 4 or less, and particularly preferably 3 or less. A plurality of polymer blocks [A] in one molecule may be the same as or different from one another.

When a plurality of different polymer blocks [A] are present in one molecule of the block copolymer [1], the weight-average molecular weight of a polymer block having a maximum weight-average molecular weight in the polymer blocks [A] is represented as Mw(A1) and the weight-average molecular weight of a polymer block having a minimum weight-average molecular weight in the polymer blocks [A] is represented as Mw(A2). In this case, a ratio "Mw(A1)/Mw(A2)" of Mw(A1) to Mw(A2) is preferably 4.0 or less, more preferably 3.0 or less, and particularly preferably 2.0 or less. When the ratio is in this range, the variation in various property values can be suppressed.

The polymer block [B] is a polymer block containing a chain conjugated diene compound unit as a main component. As described above, the chain conjugated diene compound unit refers to a structural unit having a structure formed by polymerizing a chain conjugated diene compound.

Examples of the chain conjugated diene compound corresponding to the chain conjugated diene compound unit of this polymer block [B] may include 1,3-butadiene, isoprene, 2,3-dimethyl-1,3-butadiene, and 1,3-pentadiene. One type of these may be solely used, and two or more types thereof may also be used in combination at any ratio. Among these, in order to lower the hygroscopicity thereof, a chain conjugated diene compound containing no polar group is preferable, and 1,3-butadiene and isoprene are particularly preferable.

The content ratio of the chain conjugated diene compound unit in the polymer block [B] is preferably 70% by weight or more, more preferably 80% by weight or more, and particularly preferably 90% by weight or more. When the polymer block [B] contains the aforementioned large amount of the chain conjugated diene compound unit, flexibility of the polarizing plate protective film can be improved.

The polymer block [B] may contain an optional structural unit other than the chain conjugated diene compound unit. The polymer block [B] may contain solely one type of the optional structural unit, and may also contain two or more types thereof in combination at any ratio.

Examples of the optional structural unit that the polymer block [B] may contain may include an aromatic vinyl compound unit, and a structural unit having a structure formed by polymerizing an optional unsaturated compound other than the aromatic vinyl compound and the chain conjugated diene compound. Examples of the aromatic vinyl compound unit and the structural unit having a structure formed by polymerizing the optional unsaturated compound may include the same examples as those exemplified as the units that the polymer block [A] may contain.

The content ratio of the optional structural unit in the polymer block [B] is preferably 30% by weight or less, more preferably 20% by weight or less, and particularly preferably 10% by weight or less. When the content ratio of the optional structural unit in the polymer block [B] is low, flexibility of the polarizing plate protective film can be improved.

The number of the polymer block [B] in one molecule of the block copolymer [1] is usually 1 or more, and may be 2 or more. When the number of the polymer block [B] in the block copolymer [1] is 2 or more, the polymer blocks [B] may be the same as or different from one another.

When a plurality of different polymer blocks [B] are present in one molecule of the block copolymer [1], the weight-average molecular weight of a polymer block having a maximum weight-average molecular weight in the polymer blocks [B] is represented as Mw(B1) and the weight-average molecular weight of a polymer block having a minimum weight-average molecular weight in the polymer blocks [B] is represented as Mw(B2). In this case, a ratio "Mw(B1)/Mw(B2)" of Mw(B1) to Mw(B2) is preferably 4.0 or less, more preferably 3.0 or less, and particularly preferably 2.0 or less. When the ratio is in this range, the variation in various property values can be suppressed.

The form of the block of the block copolymer [1] may be a chain block or radial block. Among these, a chain block is preferable because of excellent mechanical strength. When the block copolymer [1] has the form of the chain block, the block copolymer [1] having the polymer blocks [A] at both ends of the polymer chain thereof can suppress stickiness of the resin to a desired low value, and thus it is preferable.

The particularly preferable form of the block of the block copolymer [1] may include a triblock copolymer represented by [A]-[B]-[A] in which the polymer blocks [A] are bonded to respective ends of the polymer block [B]; and a pentablock copolymer represented by [A]-[B]-[A]-[B]-[A] in which the polymer blocks [B] are bonded to respective ends of the polymer block [A] and polymer blocks [A] are further bonded to respective other ends of the polymer blocks [B]. In particular, a triblock copolymer of [A]-[B]-[A] is especially preferable since the production is easy and properties thereof can be easily controlled to fall within desired ranges.

In the block copolymer [1], a ratio (wA/wB) of a weight fraction wA of the polymer blocks [A] in the entire block copolymer [1] and a weight fraction wB of the polymer blocks [B] in the entire block copolymer [1] falls within a specific range. Specifically, the aforementioned ratio (wA/wB) is preferably 30/70 or more, and more preferably 40/60 or more, and is usually 60/40 or less, and preferably 55/45 or less. When the ratio of wA/wB is equal to or more than the lower limit value of the aforementioned range, hardness and heat resistance of the polarizing plate protective film can be improved and birefringence thereof can be reduced. When the ratio of wA/wB is equal to or less than the upper limit value thereof, flexibility of the polarizing plate protective film can be improved. Herein, the weight fraction wA of the polymer blocks [A] represents the weight fraction of the entire polymer blocks [A], and the weight fraction wB of the polymer blocks [B] represents the weight fraction of the entire polymer blocks [B].

The weight-average molecular weight (Mw) of the block copolymer [1] is preferably 40,000 or more, more preferably 50,000 or more, and particularly preferably 60,000 or more, and is preferably 200,000 or less, more preferably 150,000 or less, and particularly preferably 100,000 or less.

The molecular weight distribution (Mw/Mn) of the block copolymer [1] is preferably 3 or less, more preferably 2 or less, and particularly preferably 1.5 or less, and is preferably 1.0 or more. Mn herein represents the number-average molecular weight.

The weight-average molecular weight (Mw) and the molecular weight distribution (Mw/Mn) of the aforementioned block copolymer [1] may be measured as a polystyrene-equivalent value by gel permeation chromatography (GPC) using tetrahydrofuran (THF) as a solvent.

Examples of the method for producing the block copolymer [1] may include a method of alternately polymerizing a monomer composition (a) containing an aromatic vinyl compound as a main component and a monomer composition (b) containing a chain conjugated diene compound as a main component by a method such as living anion polymerization or the like; and a method of sequentially polymerizing the monomer composition (a) containing an aromatic vinyl compound as a main component and the monomer composition (b) containing a chain conjugated diene compound as a main component, and then coupling the ends of the polymer blocks [B] by a coupling agent.

The content amount of the aromatic vinyl compound in the monomer composition (a) is usually 90% by weight or more, preferably 95% by weight or more, and more preferably 99% by weight or more. The monomer composition (a) may contain an optional monomer component other than the aromatic vinyl compound. Examples of the optional monomer component may include a chain conjugated diene compound and an optional unsaturated compound. The amount of the optional monomer component is usually 10% by weight or less, preferably 5% by weight or less, and more preferably 1% by weight or less, relative to the monomer composition (a).

The content amount of the chain conjugated diene compound in the monomer composition (b) is usually 70% by weight or more, preferably 80% by weight or more, and more preferably 90% by weight or more. The monomer composition (b) may contain an optional monomer component other than the chain conjugated diene compound. Examples of the optional monomer component may include an aromatic vinyl compound and an optional unsaturated compound. The amount of the optional monomer component is usually 30% by weight or less, preferably 20% by weight or less, and more preferably 10% by weight or less, relative to the monomer composition (b).

Examples of the method for obtaining respective polymer blocks by polymerizing a monomer composition may include radical polymerization, anionic polymerization, cationic polymerization, coordination anionic polymerization, and coordination cationic polymerization. From the viewpoint of facilitating the polymerization operation and the hydrogenation reaction in the later step, a method of performing radical polymerization, anionic polymerization, and cationic polymerization by living polymerization is preferable, and a method of performing polymerization by living anionic polymerization is particularly preferable.

Polymerization may be performed in the presence of a polymerization initiator. When living anionic polymerization is adopted, examples of the polymerization initiator may include monoorganolithium such as n-butyllithium, sec-butyllithium, t-butyllithium, hexyllithium, and phenyllithium; and a polyfunctional organolithium compound such as dilithiomethane, 1,4-dilithiobutane, and 1,4-dilithio-2-ethylcyclohexane. One type of these may be solely used, and two or more types thereof may also be used in combination at any ratio.

The polymerization temperature is preferably 0° C. or higher, more preferably 10° C. or higher, and particularly preferably 20° C. or higher, and is preferably 100° C. or lower, more preferably 80° C. or lower, and particularly preferably 70° C. or lower.

Examples of the style of the polymerization reaction may include solution polymerization and slurry polymerization. Among these, when solution polymerization is used, it becomes easy to remove reaction heat.

When the solution polymerization is performed, an inert solvent that can dissolve polymers obtained in respective steps may be used as the solvent. Examples of the inert solvent may include an aliphatic hydrocarbon solvent such as n-butane, n-pentane, isopentane, n-hexane, n-heptane, and isooctane; an alicyclic hydrocarbon solvent such as cyclopentane, cyclohexane, methylcyclopentane, methylcyclohexane, decalin, bicyclo[4.3.0]nonane, and tricyclo [4.3.0.1$^{2,5}$]decane; and an aromatic hydrocarbon solvent such as benzene and toluene. One type of these may be solely used, and two or more types thereof may also be used in combination at any ratio. Among these, when an alicyclic hydrocarbon solvent is used as a solvent, the alicyclic hydrocarbon solvent as it is can be used also in the hydrogenation reaction as an inert solvent, and the solubility of the block copolymer [1] is favorable, and thus it is preferable. The using amount of the solvent is preferably 200 parts by weight to 2,000 parts by weight relative to 100 parts by weight of the total of the used monomers.

When each of the monomer compositions contains two or more types of monomers, a randomizer may be used to prevent a chain of a certain component from being excessively elongated. In particular, when the polymerization reaction is anionic polymerization, it is preferable to use, for example, a Lewis base compound as the randomizer. Examples of the Lewis base compound may include an ether compound such as dimethyl ether, diethyl ether, diisopropyl ether, dibutyl ether, tetrahydrofuran, diphenyl ether, ethylene glycol diethyl ether, and ethylene glycol methyl phenyl ether; a tertiary amine compound such as tetramethyl ethylene diamine, trimethylamine, triethylamine, and pyridine; an alkali metal alkoxide compound such as potassium-t-amyloxide and potassium-t-butyloxide; and a phosphine compound such as triphenyl phosphine. One type of these may be solely used, and two or more types thereof may also be used in combination at any ratio.

The hydrogenated product [2] is a polymer obtained by hydrogenating a specific amount or more of the unsaturated bond in the block copolymer [1]. The unsaturated bond in the block copolymer [1] to be hydrogenated herein includes both the aromatic and non-aromatic carbon-carbon unsaturated bonds in the main chain and the side chain of the block copolymer [1].

The hydrogenation rate is usually 90% or more, preferably 97% or more, and more preferably 99% or more of the carbon-carbon unsaturated bonds in the main chain and the side chain and the carbon-carbon unsaturated bonds in the aromatic ring of the block copolymer [1]. As the hydrogenation rate is higher, transparency, heat resistance, and weather resistance of the polarizing plate protective film can be made favorable. Furthermore, the birefringence of the polarizing plate protective film can be easily reduced. The hydrogenation rate of the hydrogenated product [2] herein may be determined by $^1$H-NMR measurement.

In particular, the hydrogenation rate of the non-aromatic carbon-carbon unsaturated bond is preferably 95% or more, and more preferably 99% or more. By increasing the hydrogenation rate of the non-aromatic carbon-carbon unsaturated bond, light resistance and oxidation resistance of the polarizing plate protective film can be further enhanced.

The hydrogenation rate of the aromatic carbon-carbon unsaturated bond is preferably 90% or more, more preferably 93% or more, and particularly preferably 95% or more. By increasing the hydrogenation rate of the carbon-carbon unsaturated bonds in the aromatic ring, the glass transition temperature of the polymer block obtained by hydrogenating the polymer block [A] can be increased, and thus heat resistance of the polarizing plate protective film can be effectively enhanced. Furthermore, the photoelastic coefficient of the resin layer can be reduced.

The weight-average molecular weight (Mw) of the hydrogenated product [2] is preferably 40,000 or more, more preferably 50,000 or more, and particularly preferably 60,000 or more, and is preferably 200,000 or less, more preferably 150,000 or less, and particularly preferably 100,000 or less. When the weight-average molecular weight (Mw) of the hydrogenated product [2] falls within the aforementioned range, mechanical strength and heat resistance of the polarizing plate protective film can be improved. Furthermore, the birefringence thereof can be easily reduced.

The molecular weight distribution (Mw/Mn) of the hydrogenated product [2] is preferably 3 or less, more preferably 2 or less, and particularly preferably 1.5 or less, and is preferably 1.0 or more. When the molecular weight distribution (Mw/Mn) of the hydrogenated product [2] falls within the aforementioned range, mechanical strength and heat resistance of the polarizing plate protective film can be improved. Furthermore, the birefringence thereof can be easily reduced.

The weight-average molecular weight (Mw) and the molecular weight distribution (Mw/Mn) of the hydrogenated product [2] may be measured as a polystyrene-equivalent value by gel permeation chromatography (GPC) using tetrahydrofuran as a solvent.

The above-mentioned hydrogenated product [2] may be produced by hydrogenating the block copolymer [1]. As the hydrogenation method, a hydrogenation method that can increase the hydrogenation rate and suppress a chain cleavage reaction of the block copolymer [1] is preferable. Examples of such a hydrogenation method may include the methods described in International Publication No. 2011/096389 and International Publication No. 2012/043708.

Examples of the specific hydrogenation method may include a method of performing hydrogenation using a hydrogenation catalyst containing at least one type of metal selected from the group consisting of nickel, cobalt, iron, rhodium, palladium, platinum, ruthenium, and rhenium. As the hydrogenation catalyst, one type thereof may be solely used, and two or more types thereof may also be used in combination at any ratio. As the hydrogenation catalyst, any of a heterogeneous catalyst and a homogeneous catalyst may be used. It is preferable to perform the hydrogenation reaction in an organic solvent.

As the heterogeneous catalyst, a metal or a metal compound may be used as it is or with the metal or metal compound supported on a suitable carrier. Examples of the carrier may include activated carbon, silica, alumina, calcium carbonate, titania, magnesia, zirconia, diatomaceous earth, silicon carbide, and calcium fluoride. The amount of the catalyst to be supported on the carrier is preferably 0.1% by weight or more, and more preferably 1% by weight or more, and is preferably 60% by weight or less, and more preferably 50% by weight or less, relative to the total amount of the catalyst and carrier. The specific surface area of the carrier-type catalyst is preferably 100 $m^2/g$ to 500 $m^2/g$. The average pore size of the carrier-type catalyst is preferably 100 Å or more, and more preferably 200 Å or more, and is preferably 1,000 Å or less, and more preferably 500 Å or less. Herein, the specific surface area may be determined by measuring the adsorbed amount of nitrogen and using the BET formula. The average pore size may be measured by the mercury intrusion technique.

Examples of the homogeneous catalyst may include a catalyst including a compound of nickel, cobalt, or iron in combination with an organometallic compound (for example, organoaluminum compound, orgnanolithium compound); and an organometallic complex catalyst of rhodium, palladium, platinum, ruthenium, rhenium or the like.

Examples of the compound of nickel, cobalt, or iron may include an acetylacetonato compound, a carboxylic acid salt, and a cyclopentadienyl compound of each metal.

Examples of the organoaluminum compound may include alkyl aluminum such as triethyl aluminum and triisobutyl aluminum; halogenated aluminum such as diethyl aluminum chloride and ethyl aluminum dichloride; and hydrogenated alkyl aluminum such as diisobutyl aluminum hydride.

Examples of the organometallic complex catalyst may include a transition metal complex such as dihydride-tetrakis(triphenylphosphine)ruthenium, dihydride-tetrakis(triphenylphosphine)iron, bis(cyclooctadiene)nickel, and bis(cyclopentadienyl)nickel.

The using amount of the hydrogenation catalyst is preferably 0.01 part by weight or more, more preferably 0.05 part by weight or more, and particularly preferably 0.1 part by weight or more, and is preferably 100 parts by weight or less, more preferably 50 parts by weight or less, and particularly preferably 30 parts by weight or less, relative to 100 parts by weight of the block copolymer [1].

The temperature during the hydrogenation reaction is preferably 10° C. or higher, more preferably 50° C. or higher, and particularly preferably 80° C. or higher, and is preferably 250° C. or lower, more preferably 200° C. or lower, and particularly preferably 180° C. or lower. When the hydrogenation reaction is performed within such a temperature range, the hydrogenation rate can be increased, and molecular cleavage of the block copolymer [1] can be suppressed.

The hydrogen pressure during the hydrogenation reaction is preferably 0.1 MPa or more, more preferably 1 MPa or more, and particularly preferably 2 MPa or more, and is preferably 30 MPa or less, more preferably 20 MPa or less, and particularly preferably 10 MPa or less. When the hydrogenation reaction is performed at such a hydrogen pressure, the hydrogenation rate can be increased, and molecular cleavage of the block copolymer [1] can be suppressed, resulting in favorable operability.

The hydrogenated product [2] obtained by the above-described method is usually obtained as a reaction liquid containing the hydrogenated product [2], the hydrogenation catalyst, and the polymerization catalyst. Thus, the hydrogenated product [2] may be collected from the reaction liquid after the hydrogenation catalyst and the polymerization catalyst are removed from the reaction liquid by a method such as filtration or centrifugal separation. Examples of the method for collecting the hydrogenated product [2] from the reaction liquid may include a steam coagulation method of removing a solvent from a reaction liquid containing the hydrogenated product [2] by steam stripping; a direct desolvation method of removing a solvent under reduced pressure and heating; and a coagulation method of precipitating or coagulating the hydrogenated product [2] by pouring the reaction liquid into a poor solvent for the hydrogenated product.

The form of the collected hydrogenated product [2] is preferably a form of pellets so that the hydrogenated product can be easily supplied to the following silylation modification reaction (reaction to introduce an alkoxysilyl group). For example, the hydrogenated product [2] in a molten state is extruded through a die into a strand shape, cooled, and then cut by a pelletizer to form pellets to be supplied to various molding processes. When a coagulation method is used, for example, the resulting coagulated product is dried, and the product in a molten state is extruded by an extruder to form pellets in the same manner as described above, to be supplied to various molding processes.

The alkoxysilyl group-modified product [3] is a polymer obtained by introducing an alkoxysilyl group into the hydrogenated product [2] of the above-described block copolymer [1]. In the polymer, the alkoxysilyl group may be directly bonded to the above-described hydrogenated product [2] or may be indirectly bonded thereto via a divalent organic group, e.g., an alkylene group. The alkoxysilyl group-modified product [3] is excellent in adhesion strength to a wide variety of materials, and in particular, excellent in adhesion strength to an inorganic material such as glass and metal. Therefore, the polarizing plate protective film including a specific resin layer formed of a resin containing such the alkoxysilyl group-modified product [3] usually has excellent adhesion strength to the substrate of the display body. Therefore, the polarizing plate protective film can maintain a high adhesion strength to the substrate of the display body even after being exposed to a high temperature environment, a high humidity environment, or a high temperature and high humidity environment for a long period of time.

The introducing amount of the alkoxysilyl group into the alkoxysilyl group-modified product [3] is preferably 0.1 part by weight or more, more preferably 0.2 part by weight or more, and particularly preferably 0.3 part by weight or more, and is preferably 10 parts by weight or less, more preferably 5 parts by weight or less, and particularly preferably 3 parts by weight or less, relative to 100 parts by weight of the hydrogenated product [2] before the introduction of the alkoxysilyl group. When the introducing amount of the alkoxysilyl group falls within the aforementioned range, the degree of crosslinking between the alkoxysilyl groups decomposed by water or the like can be prevented from becoming excessively high, so that the adhesion strength of the polarizing plate protective film can be maintained at a high level.

The introduced amount of the alkoxysilyl group may be measured by $^1$H-NMR spectrum. When the introduced amount of the alkoxysilyl group is small, the number of times of integration may be increased to measure the introduced amount of the alkoxysilyl group.

The weight-average molecular weight (Mw) of the alkoxysilyl group-modified product [3] usually does not largely change from the weight-average molecular weight (Mw) of the hydrogenated product [2] before the alkoxysilyl group is introduced because the amount of alkoxysilyl groups introduced is small. However, when an alkoxysilyl group is introduced, the hydrogenated product [2] is modified in the presence of peroxide, so that the crosslinking reaction and the cleavage reaction of the hydrogenated product [2] proceed, and the molecular weight distribution tends to change largely. The weight-average molecular weight (Mw) of the alkoxysilyl group-modified product [3] is preferably 40,000 or more, more preferably 50,000 or more, and particularly preferably 60,000 or more, and is preferably 200,000 or less, more preferably 150,000 or less, and particularly preferably 100,000 or less. The molecular weight distribution (Mw/Mn) of the alkoxysilyl group-modified product [3] is preferably 3.5 or less, more preferably 2.5 or less, and particularly preferably 2.0 or less, and is preferably 1.0 or more. When the weight-average molecular weight (Mw) and the molecular weight distribution (Mw/Mn) of the alkoxysilyl group-modified product [3] fall within these ranges, favorable mechanical strength and tensile elongation of the polarizing plate protective film can be maintained.

The weight-average molecular weight (Mw) and the molecular weight distribution (Mw/Mn) of the alkoxysilyl group-modified product [3] may be measured as a polystyrene-equivalent value by gel permeation chromatography (GPC) using tetrahydrofuran as a solvent.

The alkoxysilyl group-modified product [3] may be produced by introducing an alkoxysilyl group into the hydrogenated product [2] of the above-described block copolymer [1]. As the method for introducing an alkoxysilyl group into the hydrogenated product [2], a method in which the hydrogenated product [2] and an ethylenic unsaturated silane compound are reacted in the presence of a peroxide may be mentioned.

As the ethylenic unsaturated silane compound, those capable of being graft-polymerized with the hydrogenated product [2] and of introducing an alkoxysilyl group into the hydrogenated product [2] may be used. Examples of such an ethylenic unsaturated silane compound may include an alkoxysilane having a vinyl group such as vinyltrimethoxysilane, vinyltriethoxysilane, dimethoxymethylvinylsilane, and diethoxymethylvinylsilane; an alkoxysilane having an allyl group such as allyltrimethoxysilane and allyltriethoxysilane; an alkoxysilane having a p-styryl group such as p-styryltrimethoxysilane and p-styryltriethoxysilane; an alkoxysilane having 3-methacryloxypropyl group such as 3-methacryloxypropyltrimethoxysilane, 3-methacryloxypropylmethyldimethoxysilane, 3-methacryloxypropyltriethoxysilane, and 3-methacryloxypropylmethyldiethoxysilane; an alkoxysilane having a 3-acryloxypropyl group such as 3-acryloxypropyltrimethoxysilane, and 3-acryloxypropyltriethoxysilane; and an alkoxysilane having a 2-norbornene-5-yl group such as 2-norbornen-5-yltrimethoxysilane. Among these, from the viewpoint of easily obtaining the effect of the present invention, vinyltrimethoxysilane, vinyltriethoxysilane, dimethoxymethylvinylsilane, diethoxymethylvinylsilane, allyltrimethoxysilane, allyltriethoxysilane, and p-styryltrimethoxysilane are preferable. As the ethylenic unsaturated silane compound, one type thereof may be solely used, and two or more types thereof may also be used in combination at any ratio.

The amount of the ethylenic unsaturated silane compound is preferably 0.1 part by weight or more, more preferably 0.2 part by weight or more, and particularly preferably 0.3 part by weight or more, and is preferably 10 parts by weight or less, more preferably 5 parts by weight or less, and particularly preferably 3 parts by weight or less, relative to 100 parts by weight of the hydrogenated product [2] before the introduction of the alkoxysilyl group.

As the peroxide, those functioning as a radical reaction initiator may be used. As the peroxide, an organic peroxide is usually used. Examples of the organic peroxide may include dibenzoyl peroxide, t-butylperoxyacetate, 2,2-di-(t-butylperoxy)butane, t-butylperoxybenzoate, t-butylcumyl peroxide, dicumyl peroxide, di-t-hexyl peroxide, 2,5-dimethyl-2,5-di(t-butylperoxyhexane), di-t-butyl peroxide, 2,5-dimethyl-2,5-di(t-butylperoxy)hexane-3, t-butyl hydroperoxide, t-butylperoxyisobutyrate, lauroyl peroxide, dipropionyl peroxide, and p-menthane hydroperoxide. Among these, those having a 1-minute half-life temperature of 170° C. to 190° C. are preferable. Specifically, t-butylcumyl peroxide, dicumyl peroxide, di-t-hexyl peroxide, 2,5-dimethyl-2,5-di(t-butylperoxyhexane), and di-t-butyl peroxide are preferable. As the peroxide, one type thereof may be solely used, and two or more types thereof may also be used in combination at any ratio.

The amount of the peroxide is preferably 0.01 part by weight or more, more preferably 0.1 part by weight or more, and particularly preferably 0.2 part by weight or more, and is preferably 5 parts by weight or less, more preferably 3 parts by weight or less, and particularly preferably 2 parts by weight or less, relative to 100 parts by weight of the hydrogenated product [2] before the introduction of the alkoxysilyl group.

The method for reacting the hydrogenated product [2] of the block copolymer [1] and the ethylenic unsaturated silane compound in the presence of a peroxide may be performed using, for example, a heating and kneading machine and a reaction vessel. As a specific example, a mixture of the hydrogenated product [2], an ethylenic unsaturated silane compound, and a peroxide are heated and melted by using a twin-screw kneader at or higher than the melting temperature of the hydrogenated product [2] to be kneaded for a desired time period. Thereby the alkoxysilyl group-modified product [3] can be obtained. The specific temperature during kneading is preferably 180° C. or higher, more preferably 190° C. or higher, and particularly preferably 200° C. or higher, and is preferably 240° C. or lower, more preferably 230° C. or lower, and particularly preferably 220° C. or lower. The kneading time is preferably 0.1 minute or more, more preferably 0.2 minute or more, and particularly preferably 0.3 minute or more, and is preferably 15 minutes or less, more preferably 10 minutes or less, and particularly preferably 5 minutes or less. When continuous kneading facilities such as a twin-screw extruder, a single-screw extruder, and the like are used, kneading and extruding may be continuously performed so that the residence time falls within the aforementioned range.

The amount of the polymer such as the alkoxysilyl group-modified product [3] in the resin is preferably 90% by weight or more, more preferably 93% by weight or more, further preferably 95% by weight or more, and particularly preferably 97% by weight or more. When the amount of the polymer in the resin falls within the aforementioned range, the desired effects of the present invention can be stably exerted.

The resin contained in the specific resin layer may contain an optional component in combination with the polymer. As the optional component, one type thereof may be solely used, and two or more types thereof may also be used in combination at any ratio.

Examples of the optional component may include a plasticizer. Since the use of such a plasticizer enables adjustment of the glass transition temperature and elastic modulus of the resin, heat resistance and mechanical strength of the resin can be adjusted. Examples of the plasticizer may include polyisobutene, hydrogenated polyisobutene, hydrogenated polyisoprene, a hydrogenated 1,3-pentadiene-based petroleum resin, a hydrogenated cyclopentadiene-based petroleum resin, a hydrogenated styrene/indene-based petroleum resin, and an ester-based plasticizer. As the plasticizer, one type thereof may be solely used, and two or more types thereof may also be used in combination at any ratio.

The amount of the plasticizer is preferably 1 part by weight or more, more preferably 3 parts by weight or more, and particularly preferably 5 parts by weight or more, and is preferably 30 parts by weight or less, more preferably 20 parts by weight or less, and particularly preferably 15 parts by weight, relative to 100 parts by weight of the polymer. When the amount of the plasticizer falls within the aforementioned range, the glass transition temperature and elastic modulus of the resin can be easily adjusted within appropriate ranges.

Further, examples of the optional component may include antioxidants. When an antioxidant is employed, adherence of oxidized degradation products of a resin to a lip portion of a die when producing a polarizing plate protective film by melt extruding the resin can be suppressed. Examples of the antioxidant may include a phenol-based antioxidant, a phosphorus-based antioxidant, and a sulfur-based antioxidant. As the antioxidant, one type thereof may be solely used, and two or more types thereof may also be used in combination at any ratio.

Among the antioxidants, a phenol-based antioxidant is preferable, and an alkyl-substituted phenol-based antioxidant is particularly preferable. Specific examples of the alkyl substituted phenol-based antioxidant may include monocyclic phenol-based antioxidants such as 2,6-di-t-butyl-p-cresol, 2,6-di-t-butyl-4-ethylphenol, 2,6-dicyclohexyl-4-methylphenol, 2,6-diisopropyl-4-ethylphenol, 2,6-di-t-amyl-4-methylphenol, 2,6-di-t-octyl-4-n-propylphenol, 2,6-dicyclohexyl-4-n-octylphenol, 2-isopropyl-4-methyl-6-t-butylphenol, 2-t-butyl-4-ethyl-6-t-octylphenol, 2-isobutyl-4-ethyl-6-t-hexylphenol, 2-cyclohexyl-4-n-butyl-6-isopropylphenol, and stearyl β-(3,5-di-t-butyl-4-hydroxyphenyl)propionate; bicyclic phenol-based antioxidants such as 2,2'-methylenebis(4-methyl-6-t-butylphenol), 4,4'-butylidenebis(3-methyl-6-t-butylphenol), 4,4'-thiobis(3-methyl-6-t-butylphenol), 2,2'-thiobis(4-methyl-6-t-butylphenol), 4,4'-methylenebis(2,6-di-t-butylphenol), 2,2'-methylenebis[6-(1-methylcyclohexyl)-p-cresol], 2,2'-ethylidenebis(4,6-di-t-butylphenol), 2,2'-butylidenebis(2-t-butyl-4-methylphenol), 3,6-dioxaoctamethylenebis[3-(3-t-butyl-4-hydroxy-5-methylphenyl)propionate], triethylene glycolbis[3-(3-t-butyl-5-methyl-4-hydroxyphenyl)propionate], 1,6-hexanediolbis[3-(3,5-di-t-butyl-4-hydroxyphenyl)propionate], and 2,2'-thiodiethylenebis[3-(3,5-di-t-butyl-4-hydroxyphenyl)propionate]; tricyclic phenol-based antioxidants such as 1,1,3-tris(2-methyl-4-hydroxy-5-t-butylphenyl)butane, 1,3,5-tris(2,6-dimethyl-3-hydroxy-4-t-butylbenzyl)isocyanurate, 1,3,5-tris[(3,5-di-t-butyl-4-hydroxyphenyl)propionyloxyethyl]isocyanurate, tris(4-t-butyl-2,6-dimethyl-3-hydroxybenzyl)isocyanurate, and 1,3,5-trimethyl-2,4,6-tris(3,5-di-t-butyl-4-hydroxybenzyl)benzene; and tetracyclic phenol-based antioxidants such as tetrakis[methylene-3-(3,5-di-t-butyl-4-hydroxyphenyl)propionate]methane.

The amount of the antioxidant is preferably 0.01 part by weight or more, more preferably 0.02 part by weight or more, and particularly preferably 0.05 part by weight or more, and is preferably 1.0 part by weight or less, more preferably 0.5 part by weight or less, and particularly preferably 0.3 part by weight or less, relative to 100 parts by weight of the polymer.

Further examples of the optional component may include stabilizers such as a thermal stabilizer, a light stabilizer, a weathering stabilizer, an ultraviolet absorber, and a near-infrared absorber; resin modifiers such as a lubricant; colorants such as a dye and a pigment, and an antistatic agent. The amounts of these may be appropriately selected within ranges that do not impair the object of the present invention.

The glass transition temperature Tg of the resin contained in the specific resin layer is preferably 30° C. or higher, more preferably 50° C. or higher, and particularly preferably 70° C. or higher, and is preferably 140° C. or lower, more preferably 120° C. or lower, and particularly preferably 100° C. or lower. When the resin has a plurality of glass transition temperatures, it is preferable that the highest glass transition temperature of the resin falls within the aforementioned range. When the glass transition temperature Tg of the resin falls within the aforementioned range, adhesion strength and heat resistance of the polarizing plate protective film can be favorably balanced. The glass transition temperature Tg of the resin may be determined as a peak top value of tan δ in the viscoelastic spectrum.

The resin contained in the specific resin layer is preferably transparent. The transparent resin herein means a resin having a total light transmittance of usually 70% or more, preferably 80% or more, and more preferably 90% or more, measured with a test piece of the resin having a thickness of 1 mm. The total light transmittance may be measured in a wavelength range of 400 nm to 700 nm using an ultraviolet-visible spectrometer.

The thickness of the specific resin layer is not particularly limited and may be a desired thickness according to the use application. The specific thickness of the specific resin layer is preferably 5 µm or more, and more preferably 10 µm or more, and is preferably 100 µm or less, and more preferably 50 µm or less.

As described above, the polarizing plate protective film may be a film of a single layer structure, and may also be a film of a multilayer structure. When the polarizing plate protective film has a multilayer structure, the polarizing plate protective film may include a plurality of specific resin layers. The polarizing plate protective film may also include a combination of a specific resin layer and an optional layer other than the specific resin layer. As the optional layer, a layer formed of a resin is usually used. Examples of the resin contained in such an optional layer may include a resin containing the block copolymer [1], a resin containing the hydrogenated product [2] of the block copolymer [1], and a cycloolefin resin such as a norbornene resin.

The thickness of the polarizing plate protective film is not particularly limited and may be a desired thickness according to the use application. The specific thickness of the polarizing plate protective film is preferably 5 µm or more, and more preferably 10 µm or more, and is preferably 100 µm or less, and more preferably 50 µm or less.

[6. Properties of Polarizing Plate Protective Film]

It is preferable that the water vapor transmission rate W [g/m²/day] at 100 µm-thickness conversion amount of the polarizing plate protective film satisfies the formula (3).

$$W \leq 10 \text{ g/m}^2/\text{day} \quad \quad \text{Formula (3)}$$

More specifically, the water vapor transmission rate W is preferably 10 g/m²/day or less, more preferably 8 g/m²/day or less, particularly preferably 5 g/m²/day or less, and ideally 0 g/m²/day. When the water vapor transmission rate W of the polarizing plate protective film is small in this manner, the polarizer can be effectively protected from water vapor. Consequently, the decrease in the polarization degree of the polarizer due to water vapor can be effectively suppressed. Also, since the polarizing plate protective film having a small water vapor transmission rate W is usually excellent in moisture resistance, peeling under high humidity environment can be effectively suppressed.

The water vapor transmission rate W of the polarizing plate protective film may be obtained by measuring water vapor transmission rate under the environment of a temperature of 40° C. and a relative humidity of 90% RH in accordance with JIS Z 0208, and converting the actual measured value into a value at a thickness of 100 µm. The conversion into a value at a thickness of 100 µm herein may be performed by multiplying the actual measured value by a coefficient represented by "100 µm/thickness [µm] of polarizing plate protective film".

The total light transmittance of the polarizing plate protective film is preferably 70% or more, more preferably 80% or more, and particularly preferably 90% or more. The haze of the polarizing plate protective film is preferably 3.0% or less, and more preferably 1.0% or less. The haze may be measured in accordance with JIS K 7136 using a 50 mm×50 mm film piece cut out from the polarizing plate protective film.

[7. Surface Roughness of Bonding Surface]

In the polarizing plate protective film, the surface to be bonded to the display body preferably has a specific arithmetic average roughness Ra. Hereinafter, the polarizing plate protective film surface to be bonded to the display body is sometimes appropriately referred to as a "bonding surface". Therefore, when the polarizing plate protective film includes the specific resin layer as the outermost layer, the bonding surface as the surface of the outermost layer preferably has a specific arithmetic average roughness Ra. The specific range of the arithmetic average roughness Ra is preferably 10 nm or more, more preferably 20 nm or more, and particularly preferably 50 nm or more, and is preferably 1000 nm or less, more preferably 900 nm or less, and particularly preferably 750 nm or less. When the arithmetic average roughness Ra is equal to or more than the aforementioned lower limit value, air can efficiently escape from the gap between the polarizing plate protective film and the display body upon bonding the polarizing plate protective film to the display body. Accordingly, occurrence of air bubbles and air gaps between the polarizing plate protective film and the display body can be effectively suppressed. When the arithmetic average roughness Ra is equal to or less than the upper limit value, local application of a large pressure onto a part of the display body upon bonding the polarizing plate protective film to the display body can be suppressed. Accordingly, the damage of the display body due to the aforementioned local pressure can be suppressed, and occurrence of dark spots can thereby be suppressed.

[8. Method for Producing Polarizing Plate Protective Film]

The polarizing plate protective film may be produced by any optional production method. For example, the polarizing plate protective film may be produced by molding resin into a film shape through a molding method such as a melt molding method and a casting method. The melt molding method may be further particularly classified into an extrusion molding method, a press molding method, an inflation molding method, an injection molding method, a blow molding method, and a stretch molding method. Among these methods, an extrusion molding method, an inflation molding method, and a press molding method are preferable to obtain the polarizing plate protective film being excellent in mechanical strength and surface accuracy. Among these, from the viewpoint of the ability to perform an efficient and simple production of the polarizing plate protective film, an extrusion molding method is particularly preferable.

The method for producing the polarizing plate protective film may further include, in combination with the step of molding resin into a film shape, an optional step. For example, the method for producing the polarizing plate protective film may include a step of processing the bonding surface of the polarizing plate protective film to adjust the arithmetic average roughness of the bonding surface to be in a specific range. Examples of the method for processing the bonding surface may include an embossing method. In the embossing method, a surface of the polarizing plate protective film is pressed with a rough surface of an embossing mold having the rough surface while heating as necessary. Accordingly, the shape of the rough surface of the embossing mold is transferred to the pressed surface, so that the bonding surface having a desired arithmetic average roughness Ra is formed on the polarizing plate protective film. The embossing mold is not particularly limited, and may be any optional mold such as a plate-shape embossing plate, a cylindrical embossing roll, and a ring-shape embossing ring.

[9. Polarizing Plate]

The polarizing plate according to the present invention includes the aforementioned polarizing plate protective film and a polarizer. The polarizing plate protective film is disposed to at least one side of the polarizer. In this polarizing plate, the polarizer is protected by the polarizing plate protective film.

As the polarizer, a film which can transmit one of two orthogonally intersecting linearly polarized lights and absorb or reflect the other may be used. Specific examples of the polarizer may include a film obtained by performing appropriate treatments such as dyeing treatment with a dichroic substance such as iodine and a dichroic dye, stretching treatment, and crosslinking treatment to a film of a vinyl alcohol-based polymer such as polyvinyl alcohol and partially formalized polyvinyl alcohol in an appropriate order and method. In particular, a polarizer containing polyvinyl alcohol is preferable. The thickness of the polarizer is usually 5 µm to 80 µm.

The polarizing plate may further include, in combination with the polarizing plate protective film and the polarizer, an optional layer. Examples of the optional layer may include an adhesive layer. An adhesive is sometimes used for bonding the polarizing plate protective film and the polarizer. In such a case, the polarizing plate may include an adhesive layer between the polarizing plate protective film and the polarizer, the adhesive layer being formed of an adhesive or a cured product of the adhesive.

Another example of the optional layer may include an optional protective film layer other than the polarizing plate protective film. For example, the polarizing plate may include an optional protective film layer on the surface of the polarizer opposite to the surface where the polarizing plate protective film is disposed.

Further examples of the optional layer may include a hardcoat layer, a low refractive index layer, an antistatic layer, and an index matching layer.

The polarizing plate may be produced by, for example, bonding the polarizer and the polarizing plate protective film. In bonding, an adhesive may be used as necessary.

Alternatively, the polarizing plate may be produced by a method including: a step of bonding a film of a vinyl alcohol-based polymer and a polarizing plate protective film to obtain a pre-stretch film; and, after the pre-stretch film is obtained, a step of dyeing the film of the vinyl alcohol-based polymer and further performing stretching to give a function as a polarizer.

In the aforementioned polarizing plate, the polarizing plate protective film protects the polarizer. Accordingly, decrease in the polarization degree of the polarizer due to high temperature, high humidity, or a heat shock, as well as occurrence of cracks in the polarizer can be suppressed. Further, since the polarizing plate protective film has appropriate stiffness, the stiffness of the entire polarizing plate can be enhanced. Therefore, deformation of the polarizing plate due to external force can be suppressed.

[10. Display Device]

The display device of the present invention includes the display body including the substrate, and the aforementioned polarizing plate. The display body is a member for controlling the display of an image in the display device, and examples thereof may include a liquid crystal display body and an organic EL display body.

The liquid crystal display body may usually include a pair of transparent substrates and a liquid crystal compound encapsulated between these substrates, and the substrate may have a function as an electrode. The liquid crystal display body may function as a liquid crystal cell. In this case, the mode as the liquid crystal cell may be any mode, and examples thereof may include an in-plane switching (IPS) mode, a vertical alignment (VA) mode, a multi-domain vertical alignment (MVA) mode, a continuous pinwheel alignment (CPA) mode, a hybrid alignment nematic (HAN) mode, a twisted nematic (TN) mode, a super-twisted nematic (STN) mode, and an optical compensated bend (OCB) mode.

Usually, the organic EL display body includes, on a substrate, a first electrode layer, a light-emitting layer, and a second electrode layer in this order, and when a voltage is applied from the first electrode layer and the second electrode layer, the light-emitting layer may generate light. Examples of the material constituting an organic light-emitting layer may include materials based on polyparaphenylenevinylene, polyfluorene, and polyvinylcarbazole. The light-emitting layer may have a layered body including a plurality of layers having different emission colors or a mixed layer in which a different pigment is doped in a layer including a certain pigment. The organic EL display body may further include a functional layer such as a barrier layer, a hole injection layer, a hole transport layer, an electron injection layer, an electron transport layer, an equipotential surface forming layer, and an electric charge generating layer.

In the aforementioned display body, the substrate may be formed of, for example, an organic material such as a resin, an inorganic material such as glass, and a combination thereof. Among these, from the viewpoint of enhancing the adhesion strength between the polarizing plate protective film and the substrate, the substrate is preferably formed of an inorganic material such as glass, metal, and a metal oxide, and particularly preferably glass. In the display device, the polarizing plate is disposed such that the polarizing plate protective film of the polarizing plate and the substrate are in direct contact with each other without an adhesive layer interposed therebetween. Usually, the bonding is effected such that the specific resin layer of the polarizing plate protective film is in contact with the substrate. Even without an adhesive layer in this manner, the polarizing plate protective film can be bonded to the substrate with high adhesion strength. Since an adhesive layer is not required in this manner, thickness reduction of the aforementioned display device by the thickness of the adhesive layer can be achieved.

Such high adhesion of the polarizing plate protective film is unlikely to be lost in high temperature environment and in high humidity environment. Therefore, in the aforementioned display device, peeling of the polarizing plate in high temperature environment and in high humidity environment can be suppressed. In particular, bonding with an adhesive in prior art, the flowability of the adhesive sometimes became excessive in high temperature environment and in high humidity environment, thereby causing the peeling at the edges of the polarizing plate and resulting in the positional misalignment of the polarizing plate. However, in the aforementioned bonding with the polarizing plate protective film, such positional misalignment is unlikely to occur.

Furthermore, in the aforementioned display device, the polarizing plate protective film protects the polarizer, and thereby decrease in the polarization degree of the polarizer due to high temperature, high humidity, or a heat shock and occurrence of cracks in the polarizer can be suppressed as previously described. In particular, although cracks were likely to occur at the edges of the polarizing plate in prior art, such cracks at the edges can be effectively suppressed in the aforementioned display device.

Also, with the stiffness of the polarizing plate protective film, the polarizing plate including this polarizing plate protective film can suppress the deformation due to external force, and also obtain high scratch resistance. In a prior art polarizing plate in which the polarizing plate protective film is omitted and the polarizer and the display body are bonded through an adhesive, the stiffness of an adhesive layer obtained from the adhesive is low, with the result that sufficient scratch resistance is difficult to obtain. For example, even when a hardcoat layer having high hardness is disposed on the surface of the polarizing plate, it is difficult to obtain a high scratch resistance to such a degree as to be expected from the hardness of the hardcoat layer, because of the low stiffness of the adhesive layer. On the other hand, in the aforementioned polarizing plate including the polarizing plate protective film, sufficient stiffness is provided to the polarizing plate protective film by the polarizing plate protective film. Therefore, for example, combining with the hardcoat layer allows for high scratch resistance of a pencil hardness of 2H or higher.

The aforementioned display device is usually produced by a production method including bonding the display body and the polarizing plate such that the substrate of the display body and the specific resin layer of the polarizing plate protective film are in contact with each other. This bonding may be performed by hot press-bonding. The hot press-bonding is preferably performed by a laminator. The bonding temperature is preferably 70° C. or higher, more preferably 80° C. or higher, and particularly preferably 90° C. or higher, and is preferably 140° C. or lower, more preferably 130° C. or lower, and particularly preferably 120° C. or lower. The linear pressure during bonding is preferably 3 N/mm or more, more preferably 5 N/mm or more, and particularly preferably 8 N/mm or more, and is preferably 50 N/mm or less, more preferably 45 N/mm or less, and particularly preferably 40 N/mm or less. By such hot press-bonding, the polarizing plate can be smoothly caused to adhere to the display body while suppressing the occurrence of wrinkles, and thereby formation of air bubbles and air gaps in the bonded portion can be suppressed.

EXAMPLE

Hereinafter, the present invention will be specifically described by illustrating Examples. However, the present invention is not limited to the Examples described below. The present invention may be optionally modified for implementation without departing from the scope of claims of the present invention and its equivalents.

In the following description, "%" and "part" representing quantity are on the basis of weight, unless otherwise specified. The operation described below was performed under the conditions of normal temperature and normal pressure, unless otherwise specified. In the following description "PVA" represents polyvinyl alcohol, unless otherwise specified.

[Evaluation Methods]
[Method for Measuring Arithmetic Average Roughness Ra]

The arithmetic average roughness Ra of a surface was measured using a surface roughness tester ("SJ400" manufactured by Mitutoyo Corporation) in accordance with JIS B 0601:1994.

[Method for Measuring Tensile Elastic Modulus]

The tensile elastic modulus of the film was measured in accordance with JIS K7113, using a tensile tester equipped with a high temperature and high humidity tank (a 5564 type digital material tester manufactured by Instron Japan Company Ltd.), by the following procedure.

From a film, a rectangular test piece (10 mm in width×250 mm in long edge length) having a long edge parallel to the lengthwise direction of the film was cut out. This test piece was strained in the long edge direction for distortion, and the stress caused thereby was measured. The conditions for measuring the stress were a temperature of 23° C., a humidity of 60±5% RH, an inter-chuck distance of 115 mm, and a tensile rate of 50 ram/min. This stress measurement was performed three times. From measurement data of the measured stress and a distortion corresponding to the stress, four pieces of measurement data were selected at intervals of 0.2% in the test piece distortion range of 0.6% to 1.2% (that is, measurement data at distortions of 0.6%, 0.8%, 1.0% and 1.2%). From the four pieces of measurement data in three measurements (total: 12 pieces of measurement data), the tensile elastic modulus of the film was calculated by a least square method.

[Method for Measuring Melt Flow Rate]

The melt flow rate of a film was measured in accordance with JIS K7210, using a melt indexer ("F-F01" manufactured by Toyo Seiki Seisaku-sho, Ltd.) under the conditions of a temperature of 190° C. and a load of 2.16 kg.

[Method for Measuring Water Vapor Transmission Rate]

The water vapor transmission rate of a film was obtained by measuring water vapor transmission rate under the environment of a temperature of 40° C. and a relative humidity of 90% RH in accordance with JIS Z 0208, and converting the actual measured value into a value at a thickness of 100 μm.

[Method for Measuring Adhesion Strength]

In Examples 1 to 3 and Comparative Examples 1 to 2, an evaluation sample was prepared in the following manner.

From the polarizing plate, a rectangular test piece of 10 mm in width×100 mm in length was cut out. This cutting out was performed such that the lengthwise direction of the test piece coincides with the absorption axis direction of the polarizer. Also, a surface of a glass slide having an arithmetic average roughness of 3 nm was subjected to a corona treatment under the conditions of an output of 300 W and a discharge amount of 200 W·min/m². After that, the polarizing plate protective film-side surface (that is, the surface opposite to the hardcoat layer) of the test piece was attached to the corona-treated surface of the glass slide. In this state, the polarizing plate was bonded by hot press to the glass slide by passing them through a laminator at a temperature of 110° C., a linear pressure of 25 N/mm, and a speed of 0.04 m/min to obtain an evaluation sample.

In Comparative Example 3, an evaluation sample was prepared in the following manner.

From the polarizing plate, a rectangular test piece of 10 mm in width×100 mm in length was cut out. This cutting out was performed such that the lengthwise direction of the test piece coincides with the absorption axis direction of the polarizer. Also, a surface of a glass slide having an arithmetic average roughness of 3 nm was subjected to a corona treatment under the conditions of an output of 300 W and a discharge amount of 200 W·min/m². After that, the polarizer-side surface (that is, the surface opposite to the hardcoat layer) of the test piece was bonded to the corona-treated surface of the glass slide through an adhesive PSA. Thus, an evaluation sample was obtained.

The adhesive PSA used herein is an adhesive obtained by adding a curing agent ("E-AX" manufactured by Soken Chemical & Engineering Co., Ltd.) to an acryl tackiness agent ("SK DYNE 2094" manufactured by Soken Chemical & Engineering Co., Ltd.) at a ratio of 5 parts by weight relative to 100 parts by weight of a polymer in the acryl tackiness agent.

After that, the peel strength in the lengthwise direction of the test piece was measured by pulling the test piece in the 180° direction with respect to the surface of the glass slide at a speed of 300 mm/min using a peel tester. This peel strength represents the adhesion strength required for peeling the specific resin layer from the glass slide. The measured adhesion strength was judged according to the following criteria.

A: Adhesion strength is 1.0 N/10 mm or higher.
B: Adhesion strength is 0.5 N/10 mm or higher and less than 1.0 N/10 mm.
C: Adhesion strength is less than 0.5 N/10 mm.

[Method for Evaluating Bonding Surface State]

As previously described in [Method for Measuring Adhesion Strength], the glass slide and the polarizing plate were bonded to obtain an evaluation sample, and the evaluation sample was thereafter observed. When bonding had been achieved without air bubbles and wrinkles, it was judged as "A". When air bubbles and wrinkles were observed, it was judged as "B".

[High Temperature Test Method]

In Examples 1 to 3, an evaluation sample for evaluating peeling and cracks was prepared in the following manner.

From the polarizing plate, a rectangular test piece of 190 mm in width×290 mm in length was cut out. This cutting out was performed such that the lengthwise direction of the test piece coincides with the absorption axis direction of the polarizer. Also, a surface of glass of 200 mm in width×300 mm in length having an arithmetic average roughness of 3 nm was subjected to a corona treatment under the conditions of an output of 300 W and a discharge amount of 200 W·min/m². After that, the polarizing plate protective film-side surface (that is, the surface opposite to the hardcoat layer) of the test piece was attached to the corona-treated surface of the glass. In this state, the polarizing plate was bonded by hot press to the glass by passing them through a laminator at a temperature of 110° C., a linear pressure of 25 N/mm, and a speed of 0.04 m/min to obtain an evaluation sample for evaluating peeling and cracks.

In Comparative Example 3, an evaluation sample was prepared in the following manner.

From the polarizing plate, a rectangular test piece of 190 mm in width×290 mm in length was cut out. This cutting out was performed such that the lengthwise direction of the test piece coincides with the absorption axis direction of the polarizer. Also, a surface of glass of 200 mm in width×300 mm in length having an arithmetic average roughness of 3 nm was subjected to a corona treatment under the conditions of an output of 300 W and a discharge amount of 200 W·min/m². After that, the polarizer-side surface (that is, the surface opposite to the hardcoat layer) of the test piece was bonded to the corona-treated surface of the glass through the adhesive PSA to obtain an evaluation sample for evaluating peeling and cracks was obtained.

After that, the evaluation sample for evaluating peeling and cracks was stored in a high temperature tank at 80° C. for 500 hours. After the storage, the evaluation sample was observed to check for the peeling of the polarizing plate from the glass and the occurrence of cracks in the polarizer.

Furthermore, in Examples 1 to 3, an evaluation sample for evaluating a polarization degree was prepared in the following manner.

From the polarizing plate, a rectangular test piece of 25 mm in width×35 mm in length was cut out. This cutting out was performed such that the lengthwise direction of the test piece coincides with the absorption axis direction of the polarizer. Also, a surface of glass of 30 mm in width×40 mm in length having an arithmetic average roughness of 3 nm was subjected to a corona treatment under the conditions of an output of 300 W and a discharge amount of 200 W·min/m². After that, the polarizing plate protective film-side surface (that is, the surface opposite to the hardcoat layer) of the test piece was attached to the corona-treated surface of the glass. In this state, the polarizing plate was bonded by hot press to the glass by passing them through a laminator at a temperature of 110° C., a linear pressure of 25 N/mm, and a speed of 0.04 m/min to obtain an evaluation sample for evaluating a polarization degree.

Furthermore, in Comparative Example 3, an evaluation sample for evaluating a polarization degree was prepared in the following manner.

From the polarizing plate, a rectangular test piece of 25 mm in width×35 mm in length was cut out. This cutting out was performed such that the lengthwise direction of the test piece coincides with the absorption axis direction of the polarizer. Also, a surface of glass of 30 mm in width×40 mm in length having an arithmetic average roughness of 3 nm was subjected to a corona treatment under the conditions of an output of 300 W and a discharge amount of 200 W·min/m². After that, the polarizing plate protective film-side surface (that is, the surface opposite the hardcoat layer) of the test piece was bonded to the corona-treated surface of the glass through the adhesive PSA to obtain an evaluation sample for evaluating a polarization degree.

The evaluation sample for evaluating a polarization degree was stored in a high temperature tank at 80° C. for 500 hours. After the storage, the polarization degree of the evaluation sample was measured using a spectrophotometer equipped with an integrating sphere ("V7100" manufactured by JASCO Corporation).

When the evaluation result was that the peeling of the polarizing plate from the glass and the occurrence of cracks in the polarizer were not observed, and the polarization degree did not decrease after the storage in the high temperature tank, it was judged as "A". When the evaluation result was that one or more of the peeling of the polarizing plate from the glass, the occurrence of cracks in the polarizer, and the decrease in polarization degree due to the storage in the high temperature tank were observed, it was judged as "B".

[High Temperature and High Humidity Test Method]

By the same operation as that in [High Temperature Test], an evaluation sample for evaluating peeling and cracks was prepared. The evaluation sample was stored in a high temperature and high humidity tank at a temperature of 60° C. and a relative humidity of 90% RH for 500 hours. After the storage, the evaluation sample was observed to check for the peeling of the polarizing plate from the glass and the occurrence of cracks in the polarizer.

Further, by the same operation as that in [High Temperature Test], an evaluation sample for evaluating a polarization degree was prepared. This evaluation sample for evaluating a polarization degree was stored in a high temperature and high humidity tank at a temperature of 60° C. and a relative humidity of 90% RH for 500 hours. After the storage, the polarization degree of the evaluation sample was measured using a spectrophotometer equipped with an integrating sphere ("V7100" manufactured by JASCO Corporation).

When the evaluation result was that the peeling of the polarizing plate from the glass and the occurrence of cracks in the polarizer were not observed, and the polarization degree did not decrease even after the storage in the high temperature and high humidity tank, it was judged as "A". When the evaluation result was that one or more of the peeling of the polarizing plate from the glass, the occurrence of cracks in the polarizer, and the decrease in polarization degree due to the storage in the high temperature and high humidity tank were observed, it was judged as "B".

[Heat Shock Test Method]

By the same operation as that in [High Temperature Test], an evaluation sample for evaluating peeling and cracks was prepared. This evaluation sample was subjected to 200 cycles of cooling and heating, in which one cycle includes cooling to −30° C. and heating to 80° C. After that, the evaluation sample was observed to check for the peeling of the polarizing plate from the glass and the occurrence of cracks in the polarizer.

Separately, by the same operation as that in [High Temperature Test], an evaluation sample for evaluating a polarization degree was prepared. This evaluation sample was subjected to 200 cycles of cooling and heating, in which one cycle includes cooling to −30° C. and heating to 80° C. After that, the polarization degree of the evaluation sample was measured using a spectrophotometer equipped with an integrating sphere ("V7100" manufactured by JASCO Corporation).

When the evaluation result was that the peeling of the polarizing plate from the glass and the occurrence of cracks in the polarizer were not observed, and the polarization degree did not decrease due to a heat shock, it was judged as "A". When the evaluation result was that one or more of the peeling of the polarizing plate from the glass, the occurrence of cracks in the polarizer, and the decrease in polarization degree due to a heat shock were observed, it was judged as "B".

[Method for Measuring Pencil Hardness]

By the same operation as that in [High Temperature Test], an evaluation sample for evaluating pencil hardness was prepared. After that, in accordance with JIS K 5600-5-4, the film surface (the surface on the hardcoat layer side) of the polarizing plate was scratched with pencils having various hardnesses at a tilt of 45° with an applied load of 500 g force. The hardness of the pencil with which a scratch was firstly made was defined as the pencil hardness.

Production Example 1. Production of Polarizer

While a long-length polyvinyl alcohol film having a thickness of 60 μm ("PE60" manufactured by Kuraray Co., Ltd.) was continuously conveyed in the lengthwise direction through a guide roll, the following operation was performed.

A dyeing treatment of immersing the polyvinyl alcohol film in a dyeing bath containing iodine and potassium iodide; and a first stretching treatment of stretching the film, having been subjected to the dyeing treatment, by 2.5 times were performed. Subsequently, the stretched film was subjected to a second stretching treatment of stretching the stretched film in an acidic bath containing boric acid and potassium iodide. The stretching ratio in the second stretching treatment was set such that a total stretching ratio represented by a product of the stretching ratio in the first stretching treatment and the stretching ratio in the second stretching treatment became 6 times. After that, the stretched film was subjected to a crosslinking treatment to obtain an iodine-PVA-based polarizer. The obtained polarizer was dried in a dryer at 70° C. for 5 minutes, and collected from the dryer.

Production Example 2. Production of Hardcoat Film

As a substrate film layer for a hardcoat film, a triacetyl cellulose film having a thickness of 40 ("FTTG40UL" manufactured by Fujifilm Corporation) having been subjected to a saponification treatment was prepared.

[Formation of Hardcoat Layer]

To 100 parts of an urethane acrylate oligomer having three or more functional groups of acryloyl groups in one molecule, 60 parts of a silicon dioxide dispersion liquid (manufactured by Nissan Chemical Industries, Ltd., number-average particle diameter: 20 nm), 3 parts of polymethyl methacrylate particles (manufactured by Sekisui Plastics Co., Ltd., number average particle: 2.0 μm), and 6 parts of a photopolymerization initiator ("IRGACURE 184" manufactured by Ciba Specialty Chemicals Corporation) were added. The mixture was stirred with a stirrer at 2000 rpm for 5 minutes to obtain a liquid composition for forming a hardcoat layer.

The liquid composition for forming a hardcoat layer was applied onto the surface of the aforementioned substrate film layer. The composition was dried (70° C.×2 minutes) and irradiated with UV light (integrated light quantity: 200 mW/cm$^2$) to form a hardcoat layer having a thickness of 5 Thus, a hardcoat film including a substrate film layer and a hardcoat layer was obtained.

Example 1

(1-1. Production of Block Copolymer [1]-1)

Into a reaction vessel equipped with a stirrer, in which the inside air was sufficiently substituted with nitrogen, 550 parts of dehydrated cyclohexane, 25.0 parts of dehydrated styrene, and 0.475 part of n-dibutylether were charged. The mixture was stirred at 60° C. While stirring was continued, 0.68 parts of n-butyllithium (a 15% cyclohexane solution) was further added into the reaction vessel. The obtained mixture was stirred at 60° C. for 60 minutes. The polymerization conversion ratio measured by gas chromatography at this point was 99.5%.

Subsequently, 50.0 parts of dehydrated isoprene was added into the reaction vessel. The mixture was continuously stirred for 30 minutes. The polymerization conversion ratio at this point was 99%.

After that, 25.0 parts of dehydrated styrene was added into the reaction vessel, and the mixture was stirred for 60 minutes. The polymerization conversion ratio at this point was nearly 100%. Then, 0.5 part of isopropyl alcohol was added into the reaction vessel to stop the reaction. The obtained block copolymer [1]-1 had a weight-average molecular weight (Mw) of 61,700 and a molecular weight distribution (Mw/Mn) of 1.05.

(1-2. Production of Hydrogenated Product [2]-1 of Block Copolymer)

The polymer solution containing the block copolymer [1]-1 was transferred into a pressure resistant reaction vessel equipped with a stirrer. Into this pressure resistant reaction vessel, 3.0 parts of a diatomaceous earth-carried nickel catalyst ("T-8400RL" manufactured by Sud-Chemie Inc.) as a hydrogenation catalyst and 100 parts of dehydrated cyclohexane were added and mixed. After that, the atmosphere inside the reaction vessel was substituted with hydrogen gas, and further supplied with hydrogen while stirring the solution, thereby to perform a hydrogenation reaction at a temperature of 170° C. and a pressure of 4.5 MPa for 6 hours. The hydrogenated product [2]-1 of the block copolymer obtained after the hydrogenation reaction had a weight-average molecular weight (Mw) of 65,300 and a molecular weight distribution (Mw/Mn) of 1.06.

After the end of the hydrogenation reaction, the reaction solution was filtered to remove the hydrogenation catalyst. After that, to the filtered reaction solution, 1.0 part of a xylene solution in which 0.1 part of pentaerythrityl.tetrakis [3-(3,5-di-t-butyl-4-hydroxyphenyl)propionate] ("Songnox 1010" manufactured by Koyo Chemical Research Center) as a phenol-based antioxidant was added and dissolved.

Subsequently, the reaction solution was filtered through a metal fiber filter (pore diameter: 0.4 μm, manufactured by Nichidai Corporation) to remove minute solid contents. After that, from the filtered reaction solution, the solvent cyclohexane and xylene as well as other volatile components were removed under the conditions of a temperature of 260° C. and a pressure of 0.001 MPa or less, using a cylindrical concentration dryer ("Kontro" manufactured by Hitachi, Ltd.). Then, the resin remaining in the concentration dryer was extruded in a melted state from a die directly coupled to the concentration dryer into a strand shape. The extruded resin was cooled, and cut with a pelletizer to obtain 90 parts of pellets of the hydrogenated product [2]-1 of the block copolymer. The obtained hydrogenated product [2]-1 of the block copolymer had a weight-average molecular weight (Mw) of 64,600 and a molecular weight distribution (Mw/Mn) of 1.11. The hydrogenation rate was nearly 100%.

(1-3. Production of Alkoxysilyl Group-Modified Product [3]-1 of Hydrogenated Product of Block Copolymer)

To 100 parts of the obtained pellets of the hydrogenated product [2]-1 of the block copolymer, 2.0 parts of vinyltrimethoxysilane and 0.2 part of 2,5-dimethyl-2,5-di(t-butylperoxy)hexane ("Perhexa (registered trademark) 25B" manufactured by NOF Corporation) were added to obtain a mixture. This mixture was kneaded using a twin-screw extruder ("TEM37B" manufactured by Toshiba Machine Co. Ltd.) at a kneading temperature of 200° C. and a retention time of 60 seconds to 70 seconds, and extruded into a strand shape. The extruded mixture was air cooled, and thereafter cut with a pelletizer to obtain 97 parts of pellets of an alkoxysilyl group-modified product [3]-1 of the hydrogenated product of the block copolymer.

10 parts of the obtained pellets of the alkoxysilyl group-modified product [3]-1 was dissolved in 100 parts of cyclohexane. After that, the solution was poured into 400 parts of dehydrated methanol to solidify the alkoxysilyl group-modified product [3]-1. The solidified alkoxysilyl group-modified product [3]-1 was filtered off, and thereafter dried under vacuum at 25° C. to isolate 9.5 parts of crumbs of the alkoxysilyl group-modified product [3]-1.

The FT-IR spectrum of the isolated alkoxysilyl group-modified product [3]-1 was measured. In the FT-IR spectrum, new absorption bands were observed at 1090 cm$^{-1}$ attributable to an Si—OCH$_3$ group, and at 825 cm$^{-1}$ and 739 cm$^{-1}$ attributable to an Si—CH$_2$ group, at different positions from 1075 cm$^{-1}$, 808 cm$^{-1}$, and 766 cm$^{-1}$ of vinyltrimethoxysilane.

Also, the $^1$H-NMR spectrum (in deuterochloroform) of the alkoxysilyl group-modified product [3]-1 was measured. In the $^1$H-NMR spectrum, an absorption band attributable to protons of a methoxy group was observed at 3.6 ppm. From the peak area ratio, it was confirmed that in the modification reaction for obtaining the alkoxysilyl group-modified product [3]-1, 1.7 parts of vinyltrimethoxysilane was bound to 100 parts of the hydrogenated product [2]-1 of the block copolymer.

(1-4. Production and Evaluation of Polarizing Plate Protective Film)

The obtained pellets of the alkoxysilyl group-modified product [3]-1 of the hydrogenated product of the block copolymer were heated using a hot air dryer with air circulation at 50° C. for 4 hours for drying. After that, the dissolved air was removed. To 100 parts by weight of the dried pellets, added were: 0.05 part of a light stabilizer (a reaction product of a formaldehyde polycondensate, {2,4,6-trichloro-1,3,5-triazine.[N,N'-bis(2,2,6,6-tetramethylpiperidine-4-yl)hexane-1,6-diyldiamine].morpholine polymer}, and formic acid; "Cyasorb (registered trademark) 3529" manufactured by Nihon Cytec Industries Inc.); and 0.05 part of an ultraviolet absorber (2-(2H-benzotriazole-2-yl)-4-(1,1,3,3-tetramethylbutyl)phenol; "Tinuvin (registered trademark) 329" manufactured by BASF Japan Ltd.). The mixture was uniformly stirred and mixed.

The obtained mixture was extrusion-molded using a T die-type film molding machine (T die width: 600 mm) having a resin melt extruder equipped with a screw having a diameter of 40 mm, under the molding conditions of a molten resin temperature of 200° C., a T die temperature of 200° C., and a roll temperature of 50° C., into a film shape with a thickness of 50 μm and a width of 500 mm. Accordingly, a single-layer structure polarizing plate protective film formed only of a specific resin layer was obtained. One surface of this polarizing plate protective film was embossed using a touch roll. This embossed shape was formed such that the embossed surface had an arithmetic average roughness Ra of 0.1 The obtained polarizing plate protective film was wound up on a roll and collected.

The tensile elastic modulus, melt flow rate, and water vapor transmission rate of the obtained polarizing plate protective film were measured by the aforementioned methods.

(1-5. Production and Evaluation of Polarizing Plate) 100 parts by weight of water, 3 parts by weight of a polyvinyl alcohol-based adhesive ("Z-200" manufactured by The Nippon Synthetic Chemical Industry Co., Ltd.), and 0.3 part by weight of a crosslinking agent ("SPM-01" manufactured by The Nippon Synthetic Chemical Industry Co., Ltd.) were mixed to obtain an adhesive. This adhesive was applied onto the substrate film layer-side surface of the hardcoat film produced in Production Example 2, and bonded to the polarizer produced in Production Example 1. In this state, the adhesive was heated and dried at 70° C. for 5 minutes. The thickness of the adhesive layer obtained after the drying of the adhesive was 0.6 μm.

Further, the adhesive was applied onto the unembossed surface of the polarizing plate protective film, and the surface was bonded to the polarizer. In this state, the adhesive was heated and dried at 70° C. for 5 minutes. The thickness of the adhesive layer obtained after the drying of the adhesive was 0.6 In this manner, a polarizing plate including a polarizing plate protective film/adhesive layer/polarizer/adhesive layer/substrate film layer/hardcoat layer in this order was obtained.

With the obtained polarizing plate, the measurement of adhesion strength, evaluation of a bonding surface, high temperature test, high temperature and high humidity test, heat shock test, and measurement of pencil hardness were performed by the aforementioned methods.

Example 2

(2-1. Production of Block Copolymer [1]-2)

Into a reaction vessel equipped with a stirrer, in which inside air was sufficiently substituted with nitrogen, 270 parts of dehydrated cyclohexane, 0.59 part of n-dibutylether, and 0.66 part of n-butyllithium (a 15% cyclohexane solution) were added. The mixture was stirred at 60° C. While stirring was continued, 25.0 parts of dehydrated styrene was continuously added over 60 minutes to perform the polymerization reaction. After the end of the addition of dehydrated styrene, the mixture was further stirred at 60° C. for 20 minutes. The polymerization conversion ratio of the reaction liquid measured by gas chromatography at this point was 99.5%.

Subsequently, a mixture of 26.0 parts of dehydrated styrene and 24.0 parts of isoprene was continuously added into the reaction vessel over 150 minutes. After the end of the addition of the mixture, the mixture was further stirred for 20 minutes. The polymerization conversion ratio at this point was 99.5%.

After that, 25.0 parts of dehydrated styrene was continuously added into the reaction vessel over 60 minutes. After the end of the addition of dehydrated styrene, the mixture was further stirred for 20 minutes. The polymerization conversion ratio at this point was nearly 100%. Then, 0.5 part of isopropyl alcohol was added into the reaction vessel to stop the reaction. The obtained block copolymer [1]-2 had a weight-average molecular weight (Mw) of 64,600, a molecular weight distribution (Mw/Mn) of 1.03, wA:wB=50:50, and w[IB]:w[IIB]=52:48. Herein, wA represents the weight fraction of the styrene block in the block copolymer [1]-2, and wB is the weight fraction of the styrene-isoprene copolymer block in the block copolymer [1]-2. w[IB] represents the weight fraction of the structural unit derived from styrene in the styrene-isoprene copolymer block, and w[IIB] represents the weight fraction of the structural unit derived from isoprene in the styrene-isoprene copolymer block.

(2-2. Production of Hydrogenated Product [2]-2 of Block Copolymer)

The polymer solution containing the block copolymer [1]-2 was transferred into a pressure resistant reaction vessel equipped with a stirrer. Into this pressure resistant reaction vessel, 7.0 parts of a diatomaceous earth-carried nickel catalyst ("E22U" manufactured by JGC C & C., nickel carrying amount: 60%) as a hydrogenation catalyst and 80 parts of dehydrated cyclohexane were added and mixed. After that, the atmosphere inside the reaction vessel was substituted with hydrogen gas, and further supplied with hydrogen while stirring the solution, thereby to perform a hydrogenation reaction at a temperature of 190° C. and a pressure of 4.5 MPa for 6 hours. The hydrogenated product [2]-2 of the block copolymer obtained after the hydrogenation reaction had a weight-average molecular weight (Mw) of 68,400 and a molecular weight distribution (Mw/Mn) of 1.04.

After the end of the hydrogenation reaction, the reaction solution was filtered to remove the hydrogenation catalyst. After that, to the filtered reaction solution, 1.0 part of a xylene solution in which 0.1 part of pentaerythrityl.tetrakis [3-(3,5-di-t-butyl-4-hydroxyphenyl)propionate] ("Songnox 1010" manufactured by Koyo Chemical Research Center) as a phenol-based antioxidant was added and dissolved.

Subsequently, from the reaction solution, the solvent cyclohexane and xylene as well as other volatile components were removed under the conditions of a temperature of 260° C. and a pressure of 0.001 MPa or less, using a cylindrical concentration dryer ("Kontro" manufactured by Hitachi, Ltd.). Then, the resin remaining in the concentration dryer was filtered at a temperature of 260° C. by a polymer filter (manufactured by Fuji Filter Mfg Co., Ltd.) coupled to the concentration dryer and including a stainless steel sintered filter having a pore size of 20 The filtrated resin was extruded in a melted state from a die into a strand shape. The extruded resin was cooled, and cut with a pelletizer to obtain 95 parts of pellets of the hydrogenated product [2]-2 of the block copolymer. The obtained hydrogenated product [2]-2 of the block copolymer had a weight-average molecular weight (Mw) of 67,700 and a molecular weight distribution (Mw/Mn) of 1.05. The hydrogenation rate was nearly 100%.

(2-3. Production and Evaluation of Polarizing Plate Protective Film)

A film molding machine for coextrusion molding, which is capable of producing a multilayer film including three layers of resin layer a/resin layer b/resin layer c was prepared. This film molding machine was provided with single screw extruders for extruding a resin corresponding to the resin layer a, a resin corresponding to the resin layer b, and a resin corresponding to the resin layer c. Each of the single screw extruders included a double flight-type screw.

Into the single screw extruder for the resin layer b of the film molding machine, the pellets of the hydrogenated product [2]-2 of the block copolymer were changed, and melted at 220° C.

Further, there was prepared a mixture of: 100 parts by weight of the dried pellets of the alkoxysilyl group-modified product [3]-1 of the hydrogenated product of the block copolymer produced in Example 1; 0.05 part of a light stabilizer (a reaction product of a formaldehyde polycondensate, {2,4,6-trichloro-1,3,5-triazine.[N,N'-bis(2,2,6,6-tetramethylpiperidine-4-yl)hexane-1,6-diyldiamine].morpholine polymer}, and formic acid; "Cyasorb (registered trademark) 3529" manufactured by Nihon Cytec Industries Inc.); and 0.05 part of an ultraviolet absorber (2-(2H-benzotriazole-2-yl)-4-(1,1,3,3-tetramethylbutyl)phenol; "Tinuvin (registered trademark) 329" manufactured by BASF Japan Ltd.). This mixture was charged into the single screw extruders for the resin layer a and the resin layer c of the film molding machine, and melted at 200° C. to obtain a molten resin.

The melted hydrogenated product [2]-2 of the block copolymer at 220° C. was supplied to a manifold for the resin layer b of a multi-manifold die through a leaf disc-shape polymer filter having openings of 3 μm.

Also, the molten resin at 200° C. containing the alkoxysilyl group-modified product [3]-1, the light stabilizer, and the ultraviolet absorber was supplied to a manifold for the resin layer a and a manifold for the resin layer c through a leaf disc-shape polymer filter having openings of 3 μm.

The hydrogenated product [2]-2 of the block copolymer, and the molten resin containing the alkoxysilyl group-modified product [3]-1, the light stabilizer, and the ultraviolet absorber were simultaneously extruded at 220° C. from the multi-manifold die into a film shape. The molded film-shaped resin was cast on a cooling roll having an adjusted surface temperature of 110° C., and subsequently passed between two cooling rolls having an adjusted surface temperature of 50° C. for curing. Accordingly, there was obtained a polarizing plate protective film with a thickness of 49 μm including: the resin layer a (thickness: 12 μm) as the specific resin layer; the resin layer b (thickness: 25 μm); and the resin layer c (thickness: 12 μm) as the specific resin layer, in this order. In this polarizing plate protective film, the resin layer a and the resin layer c were a layer of the resin containing the alkoxysilyl group-modified product [3]-1, the light stabilizer, and the ultraviolet absorber. The resin layer b was a layer of the resin containing the hydrogenated product [2]-2 of the block copolymer. One surface of this polarizing plate protective film was embossed in the same manner as in Example 1.

For the polarizing plate protective film thus obtained, tensile elastic modulus and water vapor transmission rate were measured by the aforementioned methods. Furthermore, the melt flow rate of the resin contained in the specific resin layer was measured.

(2-4. Production and Evaluation of Polarizing Plate)

A polarizing plate including a polarizing plate protective film/adhesive layer/polarizer/adhesive layer/substrate film layer/hardcoat layer in this order was obtained by the same operation as that in process (1-5) of Example 1, except that the polarizing plate protective film produced in Example 2 was used instead of the polarizing plate protective film produced in Example 1.

With the obtained polarizing plate, the measurement of adhesion strength, evaluation of a bonding surface, high temperature test, high temperature and high humidity test, heat shock test, and measurement of pencil hardness were performed by the aforementioned methods.

Example 3

(3-1. Production and Evaluation of Polarizing Plate Protective Film)

To 100 parts by weight of the pellets of the alkoxysilyl group-modified product [3]-1 of the hydrogenated product of the block copolymer produced in Example 1, 0.4 part of 2-(2H-benzotriazole-2-yl)-4-(1,1,3,3-tetramethylbutyl)phenol ("Tinuvin (registered trademark) 329" manufactured by BASF Japan Ltd.) as an ultraviolet absorber was added. The mixture was supplied to a twin screw extruder ("TEM37BS" manufactured by Toshiba Machine Co. Ltd.).

The twin screw extruder included a side feeder for adding a liquid product. From this side feeder, polyisobutene ("Nisseki Polybutene HV-300" manufactured by JX Nippon Oil &

Energy Corporation, number-average molecular weight: 1,400) as a hydrocarbon polymer to serve as a plasticizer was continuously added to the twin screw extruder such that the ratio of the polyisobutene relative to 100 parts by weight of the alkoxysilyl group-modified product [3]-1 became 10 parts by weight. In the twin screw extruder, the alkoxysilyl group-modified product [3]-1, the ultraviolet absorber, and polyisobutene were mixed, and the mixture was extruded at a resin temperature of 190° C. into a strand shape. The extruded resin was air cooled, and thereafter cut with a pelletizer to obtain 102 parts of resin pellets.

The obtained resin pellets were subjected to extrusion molding using a T die-type film molding machine (T die width: 600 mm) having a resin melt extruder equipped with a screw having a diameter of 40 mm, under the molding conditions of a temperature of 190° C., a T die temperature of 190° C., and a roll temperature of 50° C., to be in a form of a film shape with a thickness of 50 µm and a width of 500 mm. Accordingly, a single-layer structure polarizing plate protective film formed only of a specific resin layer was obtained. One surface of this polarizing plate protective film was embossed in the same manner as in Example 1. After that, the obtained polarizing plate protective film was wound up on a roll and collected.

The tensile elastic modulus, melt flow rate, and water vapor transmission rate of the obtained polarizing plate protective film were measured by the aforementioned methods.

(3-2. Production and Evaluation of Polarizing Plate)

A polarizing plate including a polarizing plate protective film/adhesive layer/polarizer/adhesive layer/substrate film layer/hardcoat layer in this order was obtained by the same operation as that in process (1-5) of Example 1 except that the aforementioned polarizing plate protective film produced in Example 3 was used instead of the polarizing plate protective film produced in Example 1.

With the obtained polarizing plate, the measurement of adhesion strength, evaluation of a bonding surface, high temperature test, high temperature and high humidity test, heat shock test, and measurement of pencil hardness were performed by the aforementioned methods.

Comparative Example 1

(C1-1. Production and Evaluation of Polarizing Plate Protective Film)

[Ring-Opening Polymerization Process]

7 parts (1 weight % relative to the total amount of monomers used for polymerization) of a mixture of DCP, TCD, and MTF (weight ratio DCP/TCD/MTF=60/35/5) and 1,600 parts of cyclohexane were charged into a reaction vessel in which the atmosphere was substituted with nitrogen. Herein, "DCP" represents tricyclo[4.3.0.1$^{2,5}$] dec-3-ene. "TCD" represents tetracyclo[4.4.0.1$^{2,5}$.1$^{7,10}$]dodeca-3-ene. Furthermore, "MTF" represents tetracyclo[9.2.1.0$^{2,10}$.0$^{3,8}$]tetradeca-3,5,7,12-tetraene.

Into this reaction vessel, 0.55 part of tri-i-butylaluminum, 0.21 part of isobutyl alcohol, 0.84 part of diisopropyl ether as a reaction regulator, and 3.24 parts of 1-hexene as a molecular weight regulator were added.

To this reaction vessel, 24.1 parts of a tungsten hexachloride solution having a concentration of 0.65% dissolved in cyclohexane was further added, and the mixture was stirred at 55° C. for 10 minutes.

Then, while the reaction system was maintained at 55° C., 693 parts of a mixture of DCP, TCD, and MTF (weight ratio DCP/TCD/MTF=60/35/5) and 48.9 parts of a tungsten hexachloride solution having a concentration of 0.65% dissolved in cyclohexane were continuously dropped into the system over 150 minutes. After that, the reaction was continued for 30 minutes and the polymerization was terminated to obtain a reaction liquid containing a ring-opening polymer.

After the termination of the polymerization, the polymerization conversion ratio of the monomer measured by gas chromatography at the termination of the polymerization was 100%.

<Hydrogenation>

The reaction liquid containing the ring-opening polymer was transferred into a pressure-resistant hydrogenation reaction vessel. Into this hydrogenation reaction vessel, 1.4 parts of a diatomaceous earth-carried nickel catalyst ("T8400RL" manufactured by Nikki Chemicals Co., nickel carrying percentage: 57%) and 167 parts of cyclohexane were added. The mixture was subjected to a reaction at a temperature of 180° C. and a hydrogen pressure of 4.6 MPa for 6 hours. The obtained reaction solution was filtered ("Fundabac Filter" manufactured by IHI corporation) under a pressure of 0.25 MPa with Radiolite #500 as a filtration bed to remove the hydrogenation catalyst. Thus, a colorless, transparent solution containing a hydrogenated product was obtained.

Subsequently, 0.5 part of an antioxidant (pentaerythritoltetrakis[3-(3,5-di-t-butyl-4-hydroxyphenyl)propionate], "Irganox 1010" manufactured by Ciba Specialty Chemicals Inc.) per 100 parts of the hydrogenated product was added to the obtained solution, and dissolved therein. Subsequently, the resultant solution was sequentially filtered through a filter ("Zeta Plus Filter 30H" manufactured by Cuno Filter Co., Ltd., pore diameter: 0.5 µm to 1 µm), and further through another metal fiber filter (manufactured by Nichidai Corporation, pore diameter: 0.4 µm) to remove minute solid contents. Accordingly, a ring-opening polymer hydrogenated product was obtained. The hydrogenation percentage of the obtained ring-opening polymer hydrogenated product was 99.9%.

<Preparation of Pellets>

Subsequently, from the solution containing the ring-opening polymer hydrogenated product, the solvent and volatile components (cyclohexane and other volatile components) were removed using a cylindrical concentration dryer (manufactured by Hitachi, Ltd.). The conditions in this operation were a temperature of 270° C. and a pressure of 1 kPa or less. Then, the ring-opening polymer hydrogenated product was extruded in a melted state into a strand shape from a die directly coupled to the concentrator. The extruded product was cooled to obtain pellets of an alicyclic polyolefin resin containing the ring-opening polymer hydrogenated product. The glass transition temperature Tg of the pellets was 125° C.

[Production of Polarizing Plate Protective Film]

The aforementioned pellets were dried at 100° C. for 5 hours. The dried pellets were supplied to an extruder and melted in the extruder. The melted product was transferred through a polymer pipe and a polymer filter, extruded from a T die on a casting drum into a sheet shape, and cooled. Accordingly, a long-length resin film having a thickness of 50 µm and a width of 1450 mm was obtained. One surface of this long-length resin film was embossed in the same manner as in Example 1 to obtain a polarizing plate protective film.

The tensile elastic modulus, melt flow rate, and water vapor transmission rate of the obtained polarizing plate protective film were measured by the aforementioned methods.

(C1-2. Production and Evaluation of Polarizing Plate)

A polarizing plate including a polarizing plate protective film/adhesive layer/polarizer/adhesive layer/substrate film layer/hardcoat layer in this order was obtained by the same operation as that in process (1-5) of Example 1, except that the polarizing plate protective film produced in Comparative Example 1 was used instead of the polarizing plate protective film produced in Example 1.

With the obtained polarizing plate, the measurement of adhesion strength and the evaluation of a bonding surface were performed by the aforementioned methods. In Comparative Example 1, the polarizing plate protective film could not be satisfactorily bonded to glass. Therefore, the high temperature test, high temperature and high humidity test, heat shock test, and measurement of pencil hardness were not performed.

Comparative Example 2

(C2-1. Production and Evaluation of Polarizing Plate Protective Film)

A polarizing plate protective film was obtained by the same operation as that in process (1-4) of Example 1, except that the pellets of the hydrogenated product [2]-1 of the block copolymer produced in Example 1 were used instead of the alkoxysilyl group-modified product [3]-1 produced in Example 1.

The tensile elastic modulus, melt flow rate, and water vapor transmission rate of the obtained polarizing plate protective film were measured by the aforementioned methods.

(C2-2. Production and Evaluation of Polarizing Plate)

A polarizing plate including a polarizing plate protective film/adhesive layer/polarizer/adhesive layer/substrate film layer/hardcoat layer in this order was obtained by the same operation as that in process (1-5) of Example 1 except that the aforementioned polarizing plate protective film produced in Comparative Example 2 was used instead of the polarizing plate protective film produced in Example 1.

With the obtained polarizing plate, the measurement of adhesion strength and evaluation of a bonding surface were performed by the aforementioned methods. In Comparative Example 2, the polarizing plate protective film could not be satisfactorily bonded to glass. Therefore, the high temperature test, high temperature and high humidity test, heat shock test, and measurement of pencil hardness were not performed.

Comparative Example 3

(C3-1. Production and Evaluation of Polarizing Plate Protective Film)

An adhesive PSA was applied onto a mold release layer of a support film having the mold release layer, and the adhesive PSA was cured to obtain an adhesive layer having a thickness of 20 μm. After that, the adhesive layer was peeled from the support film.

The tensile elastic modulus and water vapor transmission rate of the obtained adhesive layer, instead of the polarizing plate protective film, were measured. Since the adhesive PSA did not have thermoplastic properties, the measurement of a melt flow rate was not performed.

(C3-2. Production of Polarizing Plate)

A polarizing plate including a polarizer/adhesive layer/substrate film layer/hardcoat layer in this order was obtained by the same operation as that in process (1-5) of Example 1 except that a polarizing plate protective film was not bonded thereto.

With the obtained polarizing plate, the measurement of adhesion strength, evaluation of a bonding surface, high temperature test, high temperature and high humidity test, heat shock test, and measurement of pencil hardness were performed by the aforementioned methods.

[Results]

The results of the aforementioned Examples and Comparative Examples are shown in the following Table 1. In the following Table, the abbreviation means as follows.

MFR: melt flow rate of specific resin layer

TABLE 1

[Results of Examples and Comparative Examples]

| | Ex. 1 | Ex. 2 | Ex. 3 | Comp. Ex. 1 | Comp. Ex. 2 | Comp. Ex. 3 |
|---|---|---|---|---|---|---|
| Polarizing plate protective film | | | | | | |
| Tensile elastic modulus [MPa] | 740 | 740 | 270 | 2300 | 740 | 0.5 |
| MFR [g/min] | 10 | 10 | 40 | 0 | 3 | — |
| Water vapor transmission rate [g/day/min] | 4 | 4 | 4 | 1 | 4 | 152 |
| Adhesion strength [N/10 mm] Evaluation result | A | A | A | C | B | A |
| Bonding surface state | A (110° C.) | A (110° C.) | A (110° C.) | B (110° C.) | B (110° C.) | A (Room temperature) |
| High temperature test | A | A | A | — | — | B Peeling |
| High temperature high humidity test | A | A | A | — | — | B Peeling-polarization degree decrease |

TABLE 1-continued

[Results of Examples and Comparative Examples]

|  | Ex. 1 | Ex. 2 | Ex. 3 | Comp. Ex. 1 | Comp. Ex. 2 | Comp. Ex. 3 |
|---|---|---|---|---|---|---|
| heat shock test | A | A | A | — | — | B Crack |
| Pencil hardness | 2H | 2H | 2H | — | — | H |

DISCUSSION

As understood from Table 1, in Comparative Examples 1 and 2, the adhesion strength of the polarizing plate protective film to glass was weak. It is considered that this is because the polarizing plate protective films used in Comparative Examples 1 and 2 had a low melt flow rate resulting in poor spread properties during hot press-bonding, thereby failing to obtain a sufficient adhesion area. Since mounting of such a polarizing plate protective film with weak adhesion strength to a device has to be through bonding with an adhesive, the thickness increases by the thickness of the layer of the adhesive, thereby hindering the achievement of decreased thickness.

Meanwhile, in Comparative Example 3, the hardcoat film is disposed to one side of the polarizer, and the polarizing plate protective film is omitted on the other side. In Comparative Example 3, the layer of the adhesive used for bonging the polarizing plate to glass corresponds to the polarizing plate protective film. However, the layer of the adhesive used in Comparative Example 3 is poor in the ability to protect the polarizer and low in durability. Specifically, the peeling of the polarizing plate protective film occurred due to high temperature in the high temperature test; the peeling of the polarizing plate protective film and the decrease in the polarization degree of the polarizer occurred due to high humidity in the high temperature and high humidity test; and the cracks in the polarizer occurred due to a heat shock in the heat shock test. In particular, the occurrence of peeling and cracks was significant at edges.

On the other hand, in Examples 1 to 3, the polarizing plate protective film can be bonded to glass by hot press-bonding, thereby eliminating the need to use an adhesive for bonding the polarizing plate to a substrate such as a glass plate. Therefore, the layer of the adhesive can be omitted, thereby decreasing the thickness of the display device by the thickness of the layer of the adhesive to achieve the decreased thickness of the display device.

Further, in Examples 1 to 3, the peeling of the polarizing plate from glass, the occurrence of cracks in the polarizer, and the decrease in polarization degree due to the storage in the high temperature and high humidity tank are not observed in any of the high temperature test, high temperature and high humidity test, and heat shock test. Therefore, it was confirmed that the polarizing plate protective film according to the present invention is excellent in heat resistance and moisture resistance, and therefore the polarizer can be favorably protected.

The invention claimed is:

1. A polarizing plate comprising: a polarizing plate protective film, and a polarizer, the polarizing plate protective film comprising a resin layer that has a melt flow rate M [g/10 min] at a temperature of 190° C. and a load of 2.16 kg satisfying the following formula (1):

$$5 \text{ g/10 min} \leq M \qquad \text{Formula (1)}$$

wherein:
an adhesion strength caused by press-bonding of the resin layer to a glass plate surface is 1.0 N/10 mm or more, wherein the glass plate surface is a surface having an arithmetic average roughness of 3 nm which has been subjected to a corona treatment under conditions of an output of 300 W and a discharge amount of 200 W·min/m$^2$, and the press-bonding is performed under conditions of a temperature of 110° C., a linear pressure of 25 N/mm, and a speed of 0.04 m/min, the polarizing plate protective film has a tensile elastic modulus E [MPa] satisfying the following formula (2):

$$200 \text{ MPa} \leq E \leq 1{,}200 \text{ MPa} \qquad \text{Formula (2)}$$

the resin layer contains an alkoxysilyl group-modified product [3], the alkoxysilyl group-modified product [3] is an alkoxysilyl group-modified product of a hydrogenated product [2] obtained by hydrogenating 90% or more of carbon-carbon unsaturated bonds in a main chain and a side chain in a block copolymer [1] and carbon-carbon unsaturated bonds of an aromatic ring in a block copolymer [1], the block copolymer [1] has two or more polymer blocks [A] per one molecule of the block copolymer [1], and one or more polymer blocks [B] per one molecule of the block copolymer [1], the polymer block [A] containing an aromatic vinyl compound unit as a main component, the polymer block [B] containing a chain conjugated diene compound unit as a main component, a ratio (wA/wB) of a weight fraction wA of the polymer blocks [A] in the entire block copolymer [1] and a weight fraction wB of the polymer blocks [B] in the entire block copolymer [1] falls within a range of 30/70 to 60/40, and a weight-average molecular weight of the alkoxysilyl group-modified product [3] is 60,000 or more.

2. The polarizing plate according to claim 1, wherein a water vapor transmission rate W [g/m$^2$/day] at 100 μm-thickness conversion amount of the polarizing plate protective film satisfies the formula (3), $$W \leq 10 \text{ g/m}^2/\text{day} \qquad \text{Formula (3)}.$$

3. The polarizing plate according to claim 1, wherein the resin layer contains a plasticizer.

4. A display device comprising: a display body including a substrate; and the polarizing plate according to claim 1, wherein
the polarizing plate protective film of the polarizing plate and the substrate are in contact with each other.

5. The polarizing plate according to claim 1, wherein the ratio (wA/wB) is 50/50 to 60/40.

* * * * *